United States Patent
Miller et al.

(10) Patent No.: US 8,502,129 B2
(45) Date of Patent: Aug. 6, 2013

(54) INTEGRATED REMOTELY CONTROLLED PHOTOVOLTAIC SYSTEM

(75) Inventors: Wayne Miller, Los Altos, CA (US);
Brian Hinman, Los Gatos, CA (US);
Roeland Vandevelde, American Canyon, CA (US); Hossein Kazemi, San Francisco, CA (US)

(73) Assignee: Western Gas and Electric, Inc., West Lake Village, CA (US)

( * ) Notice: Subject to any disclaimer, the term of this patent is extended or adjusted under 35 U.S.C. 154(b) by 146 days.

(21) Appl. No.: 13/227,637

(22) Filed: Sep. 8, 2011

(65) Prior Publication Data
US 2012/0004780 A1 Jan. 5, 2012

Related U.S. Application Data

(63) Continuation-in-part of application No. 13/028,122, filed on Feb. 15, 2011.

(60) Provisional application No. 61/424,537, filed on Dec. 17, 2010, provisional application No. 61/424,515, filed on Dec. 17, 2010, provisional application No. 61/424,493, filed on Dec. 17, 2010, provisional application No. 61/424,518, filed on Dec. 17, 2010, provisional application No. 61/338,313, filed on Feb. 16, 2010, provisional application No. 61/424,537, filed on Dec. 17, 2010, provisional application No. 61/343,070, filed on Apr. 23, 2010.

(51) Int. Cl.
*G01J 1/44* (2006.01)

(52) U.S. Cl.
USPC .................................. 250/203.4; 363/71

(58) Field of Classification Search
USPC ................... 250/203.4; 363/16, 40, 55, 71
See application file for complete search history.

(56) References Cited

U.S. PATENT DOCUMENTS

| | | | |
|---|---|---|---|
| 7,919,953 B2* | 4/2011 | Porter et al. | 323/222 |
| 2010/0295383 A1* | 11/2010 | Cummings | 307/151 |

* cited by examiner

*Primary Examiner* — Seung C Sohn
(74) *Attorney, Agent, or Firm* — Rutan & Tucker, LLP

(57) ABSTRACT

Various methods and apparatus are described for an integrated remotely controlled photovoltaic system having a number of components. A central backend server management system is configured to facilitate management of two or more solar arrays at a remote site from a client device connected over a public wide area network (WAN). An integrated electronics housing contains multiple circuits, including power generation inverter circuits and solar array motion control circuits for one or more PhotoVoltaic (PV) solar arrays at the remote site. The multiple circuits cohesively exist in the integrated electronics housing and actually perform better because of the interconnectivity. The communication circuitry within the integrated electronics housing is configured to establish secure communications over the WAN with the central backend server management system. The integrated electronics housing acts as the local system control point for the first solar array.

20 Claims, 20 Drawing Sheets

Main Dashboard

Main Dashboard / Energy

Main Dashboard Tracker

INTEGRATED REMOTELY CONTROLLED PHOTOVOLTAIC SYSTEM

RELATED APPLICATIONS

This application is a claims the benefit of and priority to U.S. provisional application titled "Integrated electronics system" filed on Dec. 17, 2010 having application Ser. No. 61/424,537, U.S. provisional application titled "Two axis tracker and tracker calibration" filed on Dec. 17, 2010 having application Ser. No. 61/424,515, U.S. provisional application titled "ISIS AND WIFI" filed on Dec. 17, 2010 having application Ser. No. 61/424,493, and U.S. provisional application titled "Photovoltaic cells and paddles" filed on Dec. 17, 2010 having application Ser. No. 61/424,518, and this application is a continuation in part of and claims the benefit of and priority to U.S. non-provisional application titled "an inverter for a three-phase AC photovoltaic system" filed on Feb. 15, 2011 having application Ser. No. 13/028,122, which itself claims priority under 35 USC 119(e) to U.S. Provisional Application titled "Single stage dc-to-ac conversion for high efficiency operation of concentrating photovoltaic systems" filed on Feb. 16, 2010 having application Ser. No. 61/338,313 and U.S. Provisional Application titled "Integrated electronics system" filed on Dec. 17, 2010 having application Ser. No. 61/424,537, and U.S. Provisional Application titled "Solar cell substring grounding to manage inverter input voltage" filed on Apr. 23, 2010 having application Ser. No. 61/343,070.

FIELD

In general, a photovoltaic system having a remote central backend management system for multiple solar arrays is discussed.

BACKGROUND

A two-axis tracker may break up its solar array for more efficient operation. A two axis tracker may be designed for easier of installation in the field. Designing all aspects of the system yields many benefits.

SUMMARY

Various methods and apparatus are described for an integrated remotely controlled photovoltaic system having a number of components. A central backend server management system is configured to facilitate management of two or more solar arrays at a remote site from a client device connected over a public wide area network (WAN). An integrated electronics housing contains multiple circuits, including AC power generation inverter circuits and solar array motion control circuits, for one or more PhotoVoltaic (PV) solar arrays at the remote site. The multiple circuits cohesively exist in the integrated electronics housing and actually perform better because of the interconnectivity. The communication circuitry within the integrated electronics housing is configured to establish secure communications over the WAN with the central backend server management system. The integrated electronics housing acts as the local system control point for at least one or more solar arrays.

BRIEF DESCRIPTION OF THE DRAWINGS

The multiple drawings refer to the embodiments of the invention.

Figure 1A:
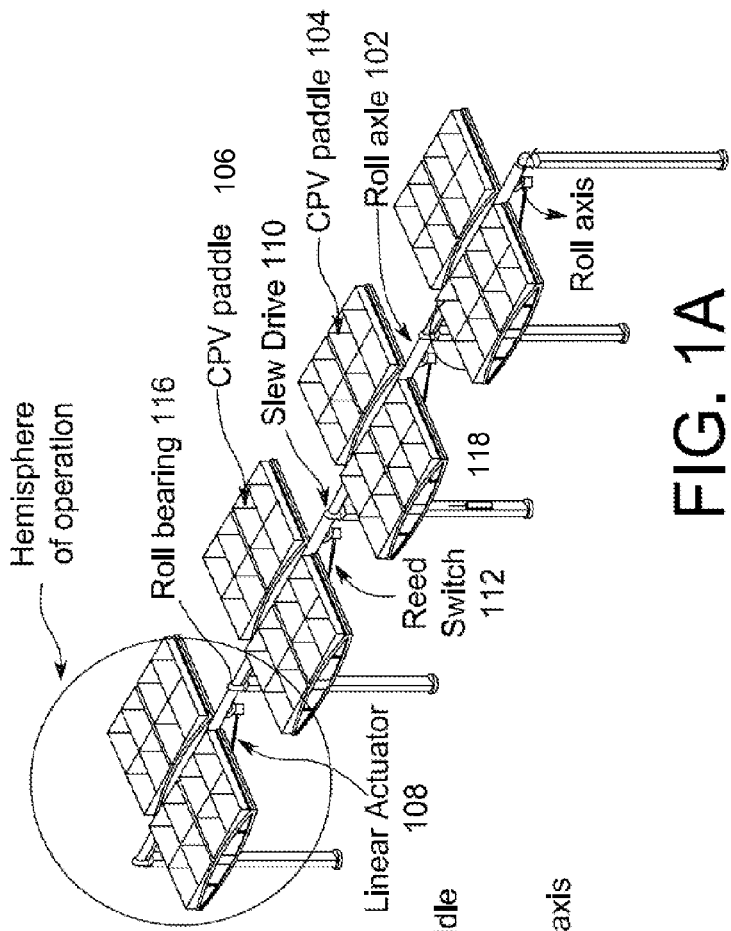
FIGS. 1A and 1B illustrate diagrams of an embodiment of a multiple-axis tracking mechanism for a photovoltaic system having multiple independently movable sets of photovoltaic solar (PV) cells.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific cells, named components, connections, types of connections, etc., in order to provide a thorough understanding of the present invention. It will be apparent, however, to one skilled in the art that the present invention may be practiced without these specific details. In other instances, well known components or methods have not been described in detail but rather in a block diagram in order to avoid unnecessarily obscuring the present invention. Further specific numeric references such as a first inverter, may be made. However, the specific numeric reference should not be interpreted as a literal sequential order but rather interpreted that the first inverter is different than a second inverter. Thus, the specific details set forth are merely exemplary. The specific details may be varied from and still be contemplated to be within the spirit and scope of the present invention.

In general, various methods and apparatus are described for an integrated remotely controlled photovoltaic system having a number of components. A central backend server management system is configured to facilitate management of two or more solar arrays at a remote site from a client device connected over a public wide area network (WAN). Each site will generally have two or more solar arrays, each on its own multiple axis tracker assembly. An integrated electronics housing contains multiple circuits, including the AC power generation inverter circuits and the solar array motion control circuits, for controlling one or more of the PhotoVoltaic (PV) solar arrays at the remote site. The multiple circuits cohesively exist in the integrated electronics housing and actually perform better because of the interconnectivity. The communication circuitry within the integrated electronics housing is configured to establish secure communications over the WAN with the central backend server management system. The integrated electronics housing acts as the local system control point for its associated one or more solar arrays.

Figure 1B:
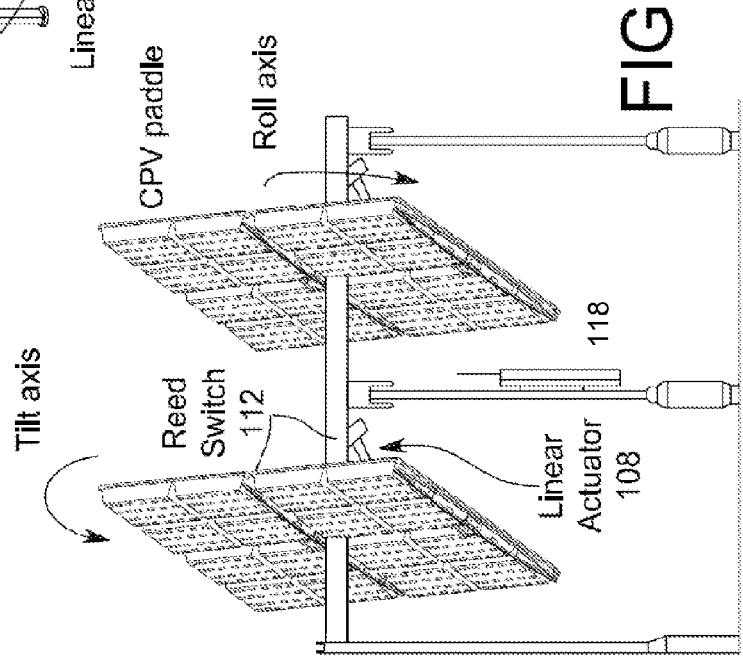

FIGS. 1A and 1B illustrate diagrams of an embodiment of a multiple-axis tracking mechanism for a photovoltaic system having multiple independently movable sets of photovoltaic solar (PV) cells. Note, the multiple-axis tracking mechanism may be used with photovoltaic cells, which may include concentrated PV cells and regular PV cells.

Figure 2:
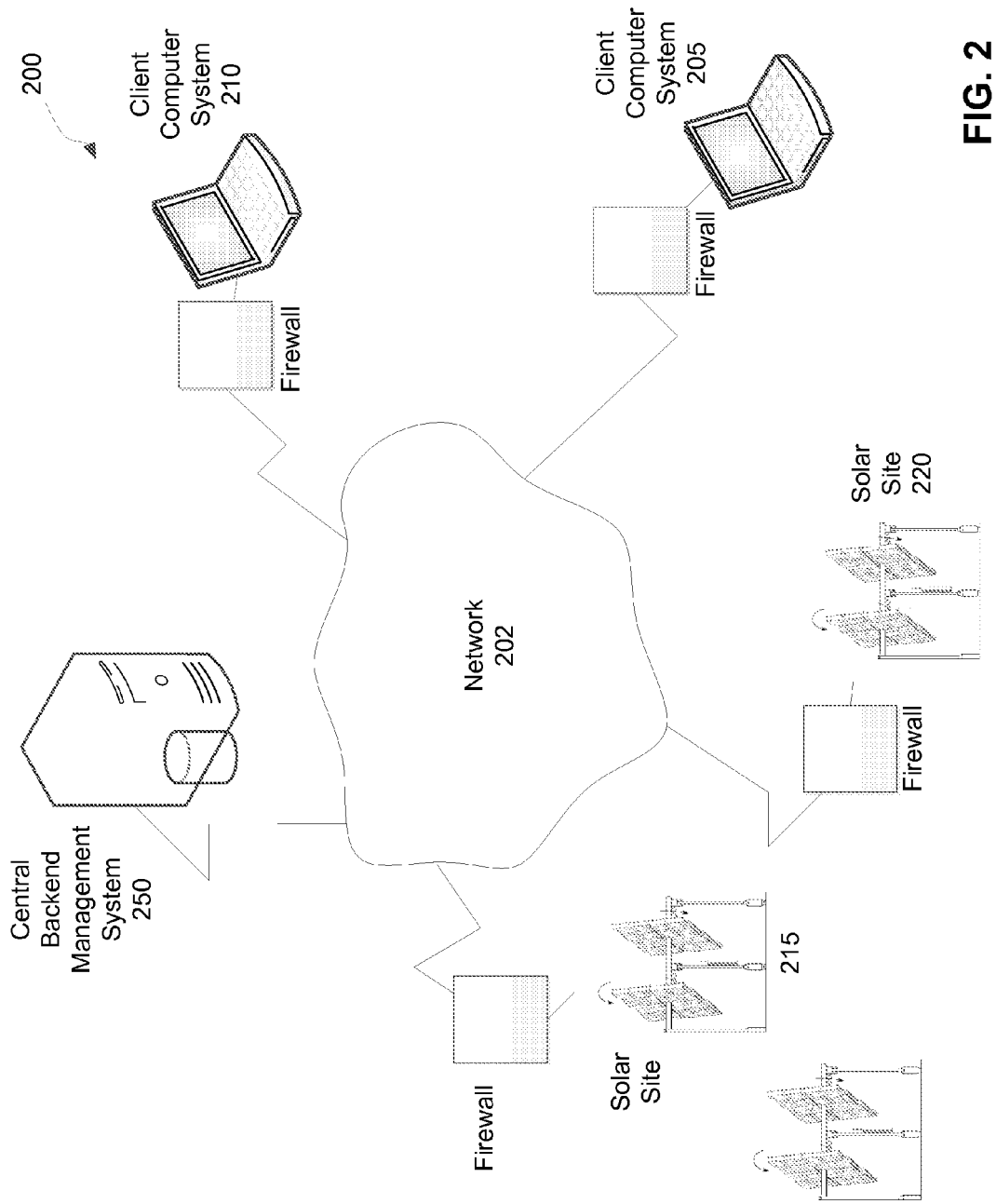
FIG. 2 illustrates a diagram of an embodiment of a network with a central backend management system communicating with multiple remote solar sites.

FIG. 2 illustrates a diagram of an embodiment of a network with a central backend management system communicating with multiple remote solar sites. The system 200 may include components configured to communicate over a network 202, which may be the Internet. The central backend management system 250 may be coupled to the network 200 and configured to enable users to control and manage solar sites from anywhere over the network 202. In the current example, solar sites 215, 220 are coupled to the network 202. There may be a firewall 216 or 221 at each of the respective solar sites 215, 220. Each of the solar sites 215, 220 may include many photovoltaic arrays. Each of the photovoltaic arrays is contained in its own multiple-axis tracker mechanism that generates an AC voltage output.

The central backend server management system 250 is configured to facilitate management of the two or more solar arrays at each remote site from a client device, such as a first client device 210, second client device 205, etc., connected over the public wide area network (WAN) 202, which encompasses networks including the Internet. A user may use a client computing system 205 or 210 to connect to the central backend management system 250 to manage the solar site 215 and/or the solar site 220. Each of the client computing systems 205, 210 may be associated with browser software to enable the users to use the Internet to access web pages associated with the central backend management system 250. There may be a firewall 206 or 211 associated with each of the client computing systems 205 and 210.

The integrated remotely controlled photovoltaic system 200 offers a complete solar power integrated system. By designing and manufacturing the entire system, the integrated remotely controlled photovoltaic system 200 has improved function, aesthetics and economics. The integrated remotely controlled photovoltaic system 200 has been streamlined and precision-engineered for high performance, low cost, quick installation, and easy maintenance. The integrated remotely controlled photovoltaic system 200 eliminates the need for multiple vendors, system integration, and expensive and time-consuming customization. The integrated remotely controlled photovoltaic system 200 includes: solar modules, trackers, inverters, motion control, communications, disconnects, and DC wiring for each PV solar array. The integrated remotely controlled photovoltaic system 200 also includes plant management software that is both easy to use and accessible from anywhere on the Internet. The integrated remotely controlled photovoltaic system 200 has optimized performance, manufacturing, delivery, installation, operation and support services.

By providing a fully integrated system, the integrated remotely controlled photovoltaic system 200 achieves greater performance, reliability, and ease of use.

Referring back to FIGS. 1A and 1B and the multiple axis tracking mechanism for the photovoltaic system, FIG. 1A shows the paddle assemblies containing the CPV cells, such as four paddle assemblies, at a horizontal position with respect to the common roll axle. FIG. 1B shows the paddle assemblies containing the CPV cells tilted up vertically by the linear actuators with respect to the common roll axle.

A common roll axle 102 is located between 1) stanchions, and 2) multiple CPV paddle assemblies. Each of the multiple paddle assemblies, such as a first paddle pair assembly 104, contains its own set of the CPV solar cells contained within that CPV paddle assembly that is independently movable from other sets of CPV cells, such as those in the second paddle assembly 106, on that two axis tracking mechanism. Each paddle pair assembly is independently moveable on its own tilt axis and has its own drive mechanism for that tilt axle. The drive mechanism may be a linear actuator with a brushed DC motor. The common roll axle 102 universally rotates all of the tilt axles, and each paddle assembly on a given tilt axle is driven by its own linear actuator along a tilt axis. An example number of twenty-four CPV cells may exist per module, with one to eight modules per CPV paddle, two or more CPV paddle structures per paddle assembly, a paddle assembly per tilt axis, and two to four independently-controlled tilt axes per common roll axis.

Each paddle pair assembly has its own tilt axis linear actuator, such as a first linear actuator 108, for its drive mechanism to allow independent movement and optimization of that paddle pair with respect to other paddle pairs in the two-axis tracker mechanism. Each tilt-axle pivots perpendicular to the common roll axle 102. The common roll axle 102 includes two or more sections of roll beams that couple to the slew drive motor 110 and then the roll beams couple with a roll bearing assembly having pin holes for maintaining the roll axis alignment of the solar two-axis tracker mechanism at the other ends, to form a common roll axle 102. The slew drive motor 110 and roll bearing assemblies are supported directly on the stanchions. A motor control board in the integrated electronics housing 118 on the solar tracker causes the linear tilt actuators and slew drive motor 110 to combine to move each paddle assembly and its CPV cells within to any angle in that paddle assembly's hemisphere of operation. Each paddle assembly rotates on its own tilt axis and the paddle assemblies all rotate together in the roll axis on the common roll axle 102.

The solar array is mounted on the two-axis tracking mechanism. The common roll axle 102 is composed of multiple segments of roll axle, each with its own a perpendicular tilt axle. Two or more paddle structures containing one or more CPV modules are installed onto each tilt axle on a common roll axle 102 as part of the two-axis tracking mechanism's solar array. The two or more paddle structures couple across the common roll axle 102 on that tilt axle. Each paddle assembly is pre-aligned by holes, brackets, or molded connection points, and any combination of these three, in a hinged curved bracket manufactured on each paddle structure in the paddle assembly for a correct coupling and positioning between the two or more paddle structures coupled across the common roll axle 102 on that tilt axle.

The two axis tracker assembly its solar array and integrated housing 118 have been designed to minimize labor and other costs during installation, and to provide for easier operation and maintenance. For example, the CPV modules are preassembled and pre-wired at the factory and can be installed directly from the pallet in the form of a paddle structure to the tracker. The sections and components making up the common roll axle 102, the single electronics housing 118 mountable on the tracker, and the components for each paddle pair assembly are manufactured in simple modular sections that assemble easily in the field and also maintain a rough alignment of the tracker assembly.

The tracker circuitry in the integrated electronics housing 118 uses primarily the Sun's angle in the sky relative to that solar array to move the angle of the paddles to the proper position to achieve maximum irradiance. A hybrid algorithm determines the known location of the Sun relative to that solar array via parameters including time of the day, geographical location, and time of the year supplied from a local GPS unit on the tracker, or other similar source. The two-axis tracker tracks the Sun based on the continuous latitude and longitude feed from the GPS and a continuous time and date feed. The hybrid algorithm will also make fine tune adjustments of the positioning of the modules in the paddles by periodically analyzing the power (I-V) curves coming out of the electrical power output circuits to maximize the power coming out that solar tracker.

The hybrid solar tracking algorithm resident in the integrated electronics housing 118 supplies guidance to the motor control board for the slew drive and tilt actuators to control the movement of the two-axis solar tracker mechanism. The hybrid solar tracking algorithm uses both 1) an Ephemeris calculation and 2) an offset value from a matrix to determine the angular coordinates for the CPV cells contained in the two-axis solar tracker mechanism to be moved to in order to achieve a highest power out of the CPV cells. The matrix can be populated with data from periodic calibration measurements of actual power being generated by a power output circuit of the two-axis solar tracker mechanism and applies Kalman filtering to those measurements over time of the operation of the solar tracking mechanism to create an offset value from the matrix applied to results of the Ephemeris calculation to determine the angular coordinates for the CPV cells. The motion control circuit is configured to move the CPV cells to the determined angular coordinates resulting from the offset value being applied to the results of the Ephemeris calculation.

Note, optimally tracking the Sun with four independently moveable paddle pair assemblies on a solar array is easier and more accurate across the four paddle pairs than with a single large array occupying approximately the same amount of area as the four arrays. In an example, four or more paddles, each contains a set of CPV cells, and form a part of the two-axis solar tracker mechanism. Each of these paddles may be part of a paddle pair assembly that rotates on its own tilt axis. For example, both a first paddle structure containing CPV cells on a first section of a first tilt axle and a second paddle structure containing CPV cells on a second section of the first tilt axle rotate on the axis of that first tilt axle. Likewise, both a third paddle structure containing CPV cells on a first section of a second tilt axle and a fourth paddle structure containing CPV cells on a second section of the second tilt axle rotate on the axis of that second tilt axle. In addition, both the first and second tilt axles connect perpendicular to the common roll axle that universally rotates all of the tilt axles.

The two-axis tracker includes a precision linear actuator for each of the paddle pairs in the four paddle pairs joined on the shared stanchions as well as the slew drive connect to the common roll axle 102. A set of magnetic reed sensors can be used to determine reference position for tilt linear actuators to control the tilt axis as well as the slew motor to control the roll axis on the common roll axle 102. Each tilt linear actuator may have its own magnetic reed switch sensor, such as a first magnetic reed sensor 112.

Figure 3:
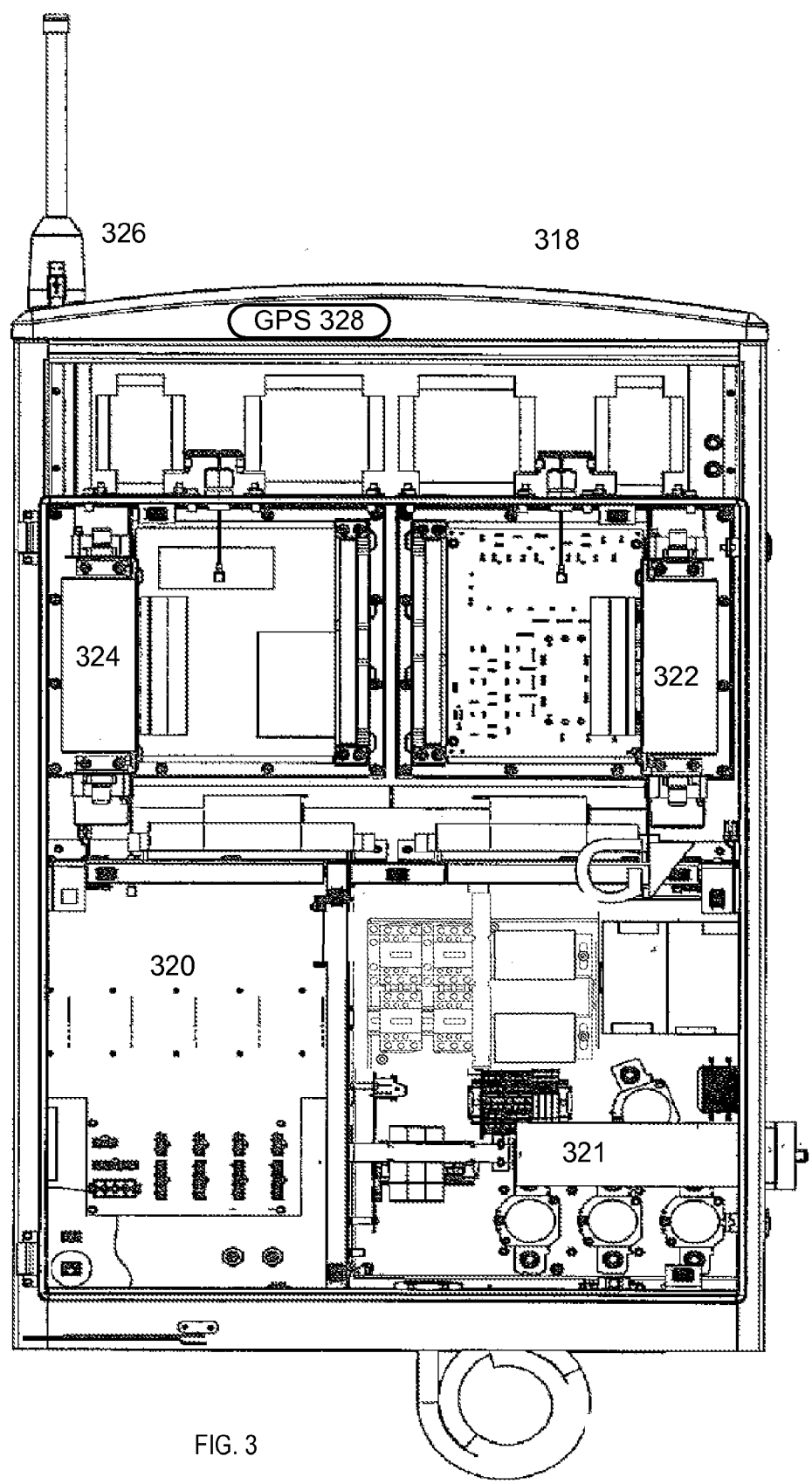
FIG. 3 illustrates a diagram of an embodiment of the integrated electronics housing with the front door and some isolation plates removed.

FIG. 3 illustrates a diagram of an embodiment of the integrated electronics housing with the front door and some isolation plates removed. The integrated electronics system is housed in an at least partially weather-tight housing unit. The integrated electronics housing 318 acts as the local system control point for the solar array. The integrated electronics housing 318 contains the motion control circuitry 320 that controls the movement of the two axis tracker, two or more inverter circuits 322, 324 that receive DC power from the CPV cells and converts the DC voltage to three phase AC power for the power grid, Wi-Fi circuitry 326, a main I/O board 321 with various circuits and software routines that collect and report performance, position, diagnostic, and weather data to the central backend management system. The housing 318 may also have a GPS unit 328 mounted in or on the housing, along with having the Wi-Fi antenna.

Figure 4:
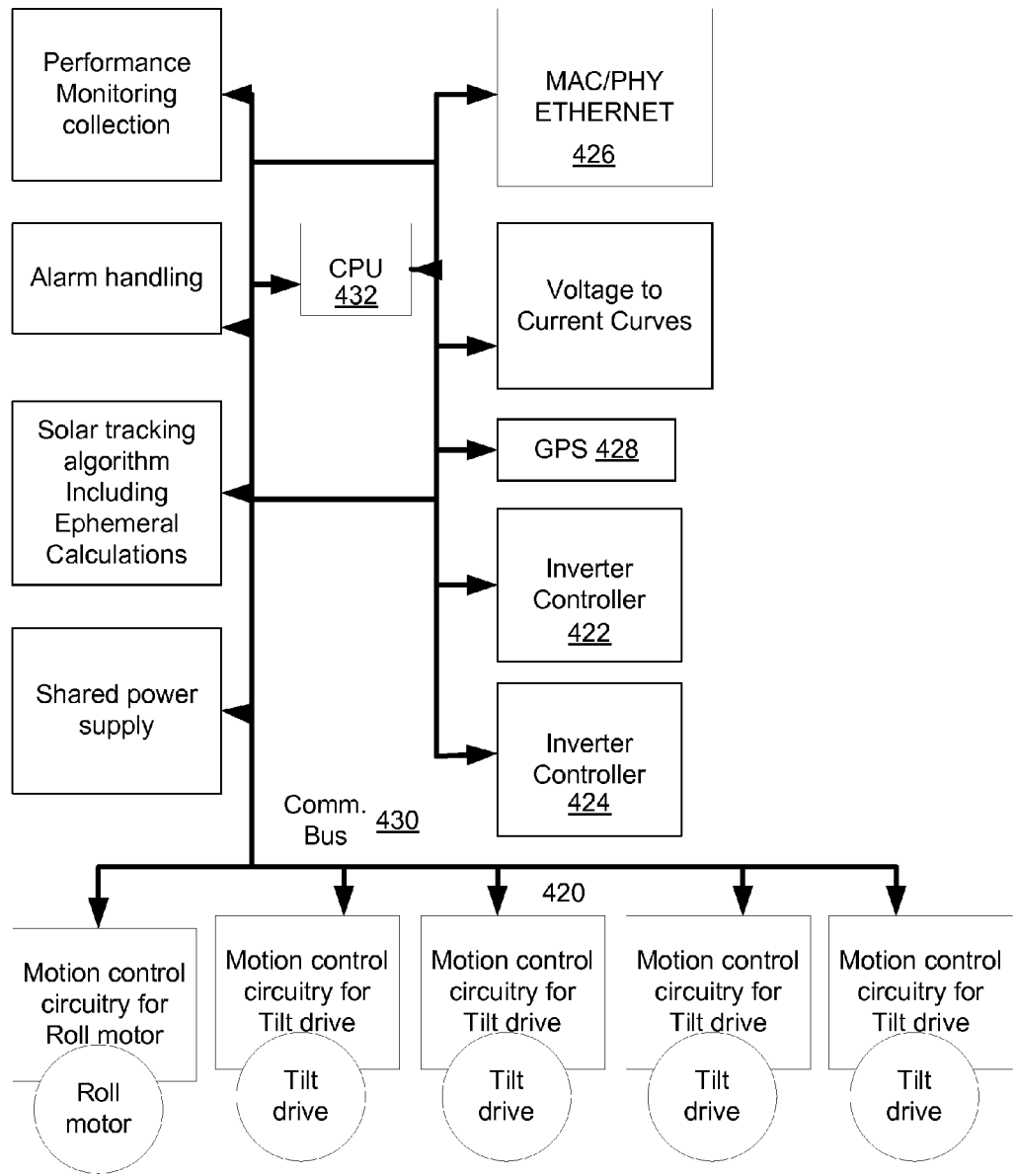
FIG. 4 illustrates a diagram of an embodiment of the integrated electronics housing containing both system electronics and power generation circuits.

FIG. 4 illustrates a diagram of an embodiment of the integrated electronics housing containing both system electronics and power generation circuits. The integrated electronics housing contains multiple circuits for the PhotoVoltaic (PV) solar array at the remote site. The multiple circuits cohesively exist in the integrated electronics housing and actually perform better because of the interconnectivity. One or more Alternating Current (AC) inverter circuits 422, 424 within the integrated electronics housing have switching devices that generate a three-phase AC voltage supplied to a utility power grid interface transformer. One or more motion control circuits 420 within the integrated electronics housing are configured to move the PV cells of the solar array throughout the day to angular coordinates resulting from a solar tracking algorithm feeding the motion control circuits. A communication bus 430 within the integrated electronics housing connects to the motion control circuits 420 and the inverter circuits 422 to facilitate communications of information including parameters of power being generated by the inverter circuits between the motion control circuits and the AC inverter circuits to fine tune an AC power generated out of the two axis tracker mechanism. The communication circuitry 426 within the integrated electronics housing establishes secure communications over the wide area network with the central backend server management system. The motion control circuits 420 and AC inverter circuits 422, 424 also pass information over the communication bus 430 to the communication circuitry 426.

As discussed, the motion control circuitry 420 that controls the movement of the CPV cells on the two-axis tracker assembly. The motion control circuitry 420 includes a single slew drive for roll rotation and multiple linear actuator drives for tilt rotation for all of the CPV cells on the two-axis tracker assembly. The motion control circuitry 420 controls the angles of the paddles with the CPV cells inside to track the Sun for maximum irradiance.

Each inverter circuit 422, 424 within the housing receives DC power from its own set of CPV cells, which are potentially located all on the same side of the tracker assembly and converts that DC power from the CPV cells to three phase 480 VAC power for the power grid.

The solar tracking algorithm may be a hybrid open and closed loop tracking algorithm configured to supply coordinates to the motion control circuit to adjust/fine tune the angle of the CPV cells to a maximum power output. A Global Position System unit 428 may be mounted in or on the housing and configured to continuously feed the time, date, and geographical position information, including latitude and longitude, to the solar tracking algorithm resident within the integrated electronics housing for an Ephemeris calculation. The GPS circuit, Wi-Fi circuit and some on-board configured algorithms, also combine to enable automatic solar array commissioning of each solar array at the remote solar site. The newly installed integrated electronics housing will call the central management server system and identify itself with at least the GPS coordinates.

The electronic housing contains performance monitoring circuitry is integrated into some or all of the components including the motion control circuits 520 and the inverter circuits 422, 424. Software coding and logic circuitry are built-in for PV string level performance monitoring on each array to allow 1) real-time performance feedback, 2) remote monitoring of the two axis tracker assembly, and 3) local measurements and generation of a current-voltage (IV) curve, 4) a built in controller using the solar tracking algorithm with a hybrid open and closed loop tracking algorithm configured to supply coordinates to the motion control circuit to adjust/fine tune the angle of the PV cells to achieve a maximum power output; 5) a voltage clamp circuit to limit the DC input voltage to less than 1200 VDC; and 6) many other features. The configured logic, resident software applications or any combination of both is configured to actively push the performance monitoring information to the central backend management system instead of the central backend management system having to poll each PV solar array associated with its own SCP. The communication between each SCP and the central backend management system is performed using the secure communication channel protocol as discussed, but may also require the verification of the identity of both the central backend management system and that specific SCP.

The solar array is mounted on the high-precision, two-axis, solar tracker assembly and the integrated electronic housing may be mounted on the two-axis tracker assembly. Individual motion control is provided for each paddle pair in the solar array by the motion control circuits 420. The motion control circuits 420 provide precision tracking to increase yield. Most photovoltaic systems are mounted in a fixed position. They operate at maximum production only during a brief period of the day when the Sun's rays fall directly normal to the module surface. The motion control circuits 420 move the solar array to accurately track the Sun through the day and year so that the solar modules operate at peak efficiency, resulting in a dramatically greater energy harvest than a fixed-tilt system.

The central processor circuitry 432 is configured to perform the Ephemeris calculation of the solar tracking algorithm for use by the motion control circuits 420 to position the CPV cells relative to a current angle of the Sun. The Ephemeris calculation provides the data to position the CPV panels relative to the current angle of the Sun. The central processor circuitry 432 also performs computing and generation of alarms in near real time, calculating performance modeling, and other general processing include network communications requiring computation to transmit to the central backend management system over the Internet.

The solar tracking algorithm uses both 1) the Ephemeris calculation, with local GPS position data of the solar tracker mechanism from a global positioning circuit that is part of the integrated electronics housing to determine angular coordinates that CPV cells contained in the two axis tracker assembly should be ideally positioned to relative to a current position of the Sun and 2) applies Kalman filtering that is continuously updated with power measurements over the time of an operation the two axis tracker assembly to create the offset matrix. The measured actual power output comes from the (I-V) curves taken off the inverter circuits 422, 424. Power optimization may occur in the solar array through integration of inverter and tracker motion control circuits and feedback between each other to fine tune the power optimization.

The housing may also contain additional intelligent power and control circuits that can respond to events on site and that also cooperate with the central backend management system for control of the local devices over the Internet.

Figure 5:
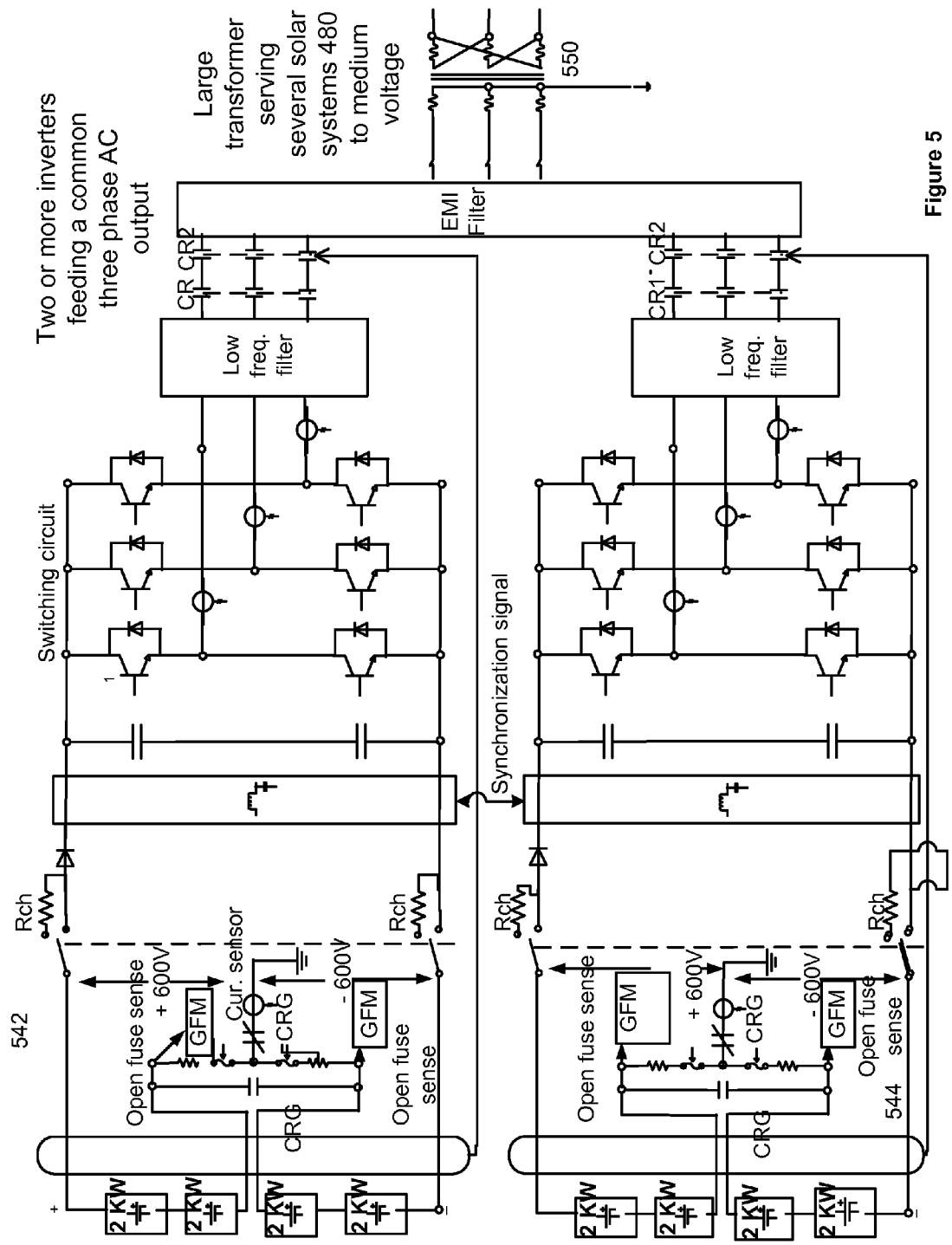
FIG. 5 illustrates a diagram of an embodiment of at least two or more AC inverter circuits that are contained with the integrated electronics housing.

FIG. 5 illustrates a diagram of an embodiment of at least two or more AC inverter circuits that are contained with the integrated electronics housing. An example first three-phase AC inverter circuit 542 of the two or more inverter circuits and a second three-phase AC power generation unit 544 of the two or more inverter circuits are contained with the integrated electronics housing.

Each AC inverter circuit 542, 544 has a single stage DC-to-AC voltage conversion circuit. Each inverter circuit 542, 544 receives a bipolar DC voltage supplied from its own set of CPV cells. Each three-phase AC inverter circuit 542, 544 has no need for a supplemental input DC voltage level boosting strategy, including a DC input boost stage to increase the DC input voltage level to a higher DC voltage level for the DC to AC conversion, because the supplied bipolar DC input voltage level from the set of CPV cells is high enough to directly convert to the AC working voltage level.

Figure 6:
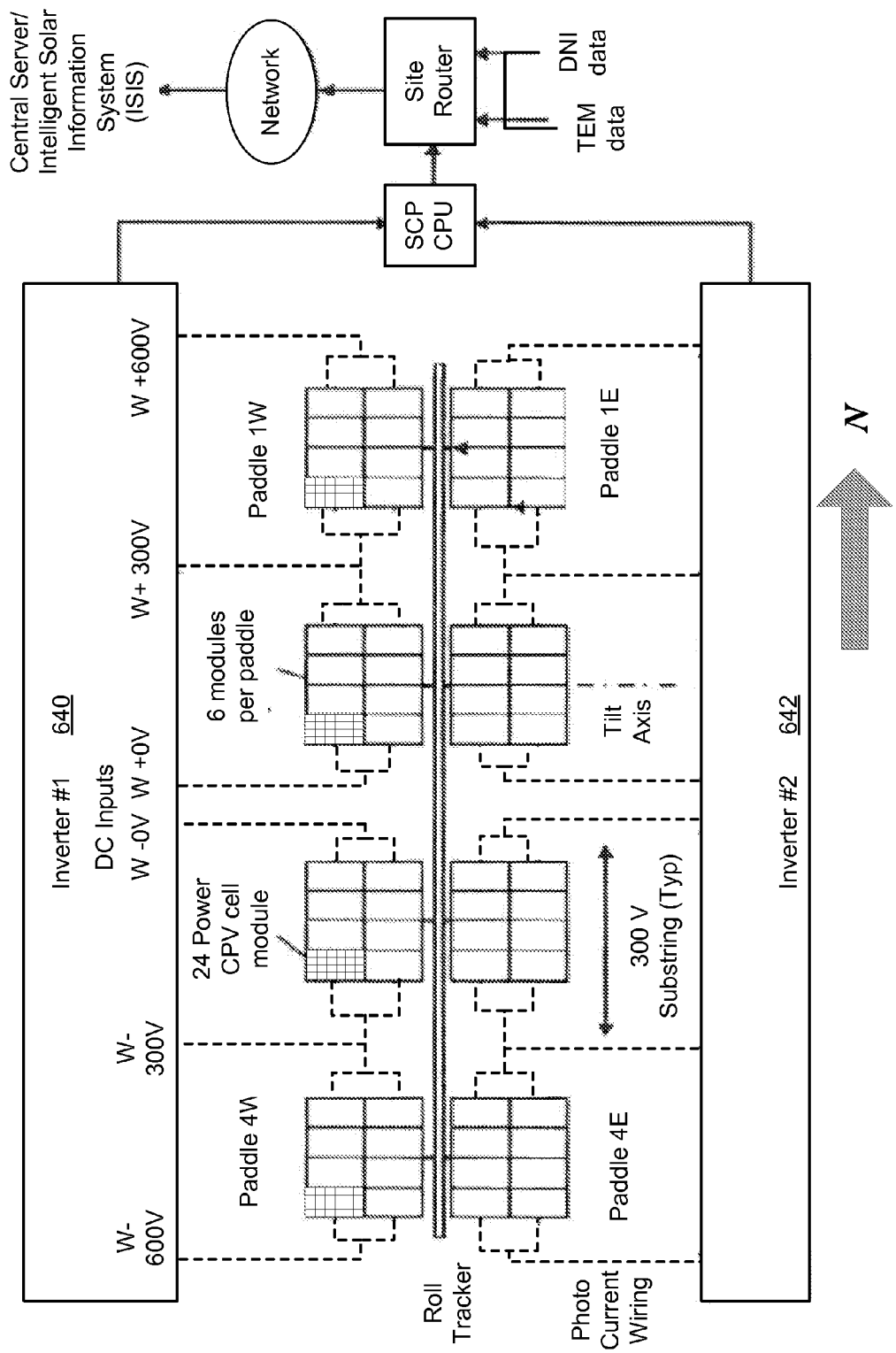
FIG. 6 illustrates a block diagram of an embodiment of the physical and electrical arrangement of modules in a representative two axis tracker assembly.

Each inverter circuit 542, 544 may have multiple strings of CPV cells feeding that inverter circuit. Each inverter circuit 542, 544 receives the bipolar DC voltage supplied from its own set of CPV cells. The strings connect to the inverter circuit which allows the multiple strings of CPV cells to each supply less than a nominal 600 VDC and use less costly conduit and cables to carry the maximum 600 VDC input voltage from that string to the housing enclosure. See also FIG. 6 illustrating a block diagram of an embodiment of multiple strings of CPV cells to each supply less than a nominal 600 VDC to each inverter circuit within the integrated electronics housing. Merely, the housing enclosure of the integrated electronic housing is required to accommodate voltages of up to 1200 VDC.

The multiplicity of the three phase AC inverter circuits electrically connect into a common three phase AC output to feed a single Utility Power Grid transformer 550. Each inverter circuit 542, 544 has its own set of isolation contacts to connect as well as isolate this particular inverter from the Utility Power Grid interface transformer 550. A primary-side common node of the Utility Power grid interface transformer 550 may be connected to Earth ground. The outputs of the two or more AC inverter circuit 542, 544 combine to supply the primary-side common node of the Utility Power grid interface transformer.

FIG. 6 illustrates a block diagram of an embodiment of the physical and electrical arrangement of modules in a representative two axis tracker assembly. In an example, set of two or more paddle pair assemblies exist per two axis tracker mechanism, and the paddle structures may each have a fixed number of CPV cells to establish a roughly fixed range of input voltage for an inverter circuit 640, 642 that will convert the DC voltage from the concentrated photovoltaic cells into three phase AC voltage. There may be plurality of solar receivers per module such as twenty four, eight modules per paddle structure, two paddle structures forming a paddle pair assembly per tilt axis, and four independently-controlled tilt axles per common roll axle, and a bi-polar voltage from the CPV cells in the set of paddle pair assemblies may be, for example, a +600 VDC and a −600 VDC making a 1200 VDC output coming from the sixteen PV modules, where the sixteen PV module array may be a string/row of CPV cells arranged in an electrically series-parallel arrangement of two +300 VDC strings adding together to make the +600 VDC, along with two 300 VDC strings adding together to make the −600 VDC. The absolute voltage level supplied can range from an absolute 700-1200 VDC. One or more strings of multiple junction solar cells from the solar array are wired together such that its highest end-to-end voltage, unloaded, cold cells is not in excess of 1200 V DC but supplied at a high enough level to directly convert this DC input voltage level to a 480 V AC working voltage level coming out of each three-phase AC inverter circuit while avoiding the need for a DC boost stage in each three-phase AC inverter circuit. For each string of CPV cells feeding an inverter, a dynamic common reference point circuit creates a zero volts DC reference point between paddles.

As discussed, the integrated electronic housing contains multiple circuits that cohesively exist in a single and actually perform better because of the interconnectivity. Each inverter circuit in the integrated electronic housing has a maximum power point tracking circuit (MPPT) configured to proactively seek the optimum performance point for the paddle pair assemblies of the solar array associated with that MPPT. Stable, secure operation utilizing closed-loop feedback is provided by an on-board system control CPU. The integrated electronics housing for each 16-kW CPV array can be equipped with two or more, high-efficiency, industrial-grade inverter circuits in NEMA-4 enclosure. This provides a distributed configuration that simplifies installation and maximizes overall power plant uptime. The dual, ±600 V, bi-polar inverters convert the DC power from the module strings directly to 480 V, 3-phase, AC power without the use of transformers. The one or more DC-to-AC inverter circuits is included in the integrated electronics housing for that array, eliminate combiner boxes, fuses, and in-ground DC wiring, thereby further reducing costs during installation. This integrated electronic housing design reduces complexity and cost while also reducing wiring and other installation labor.

As discussed, at least the motion control, inverter circuits, and the ground fault circuitry contain distributed performance monitoring circuitry, which provides remote reporting of measurements and potentially notification of alarms in near real time over the site router and WAN over to the central management server system.

Figure 7:
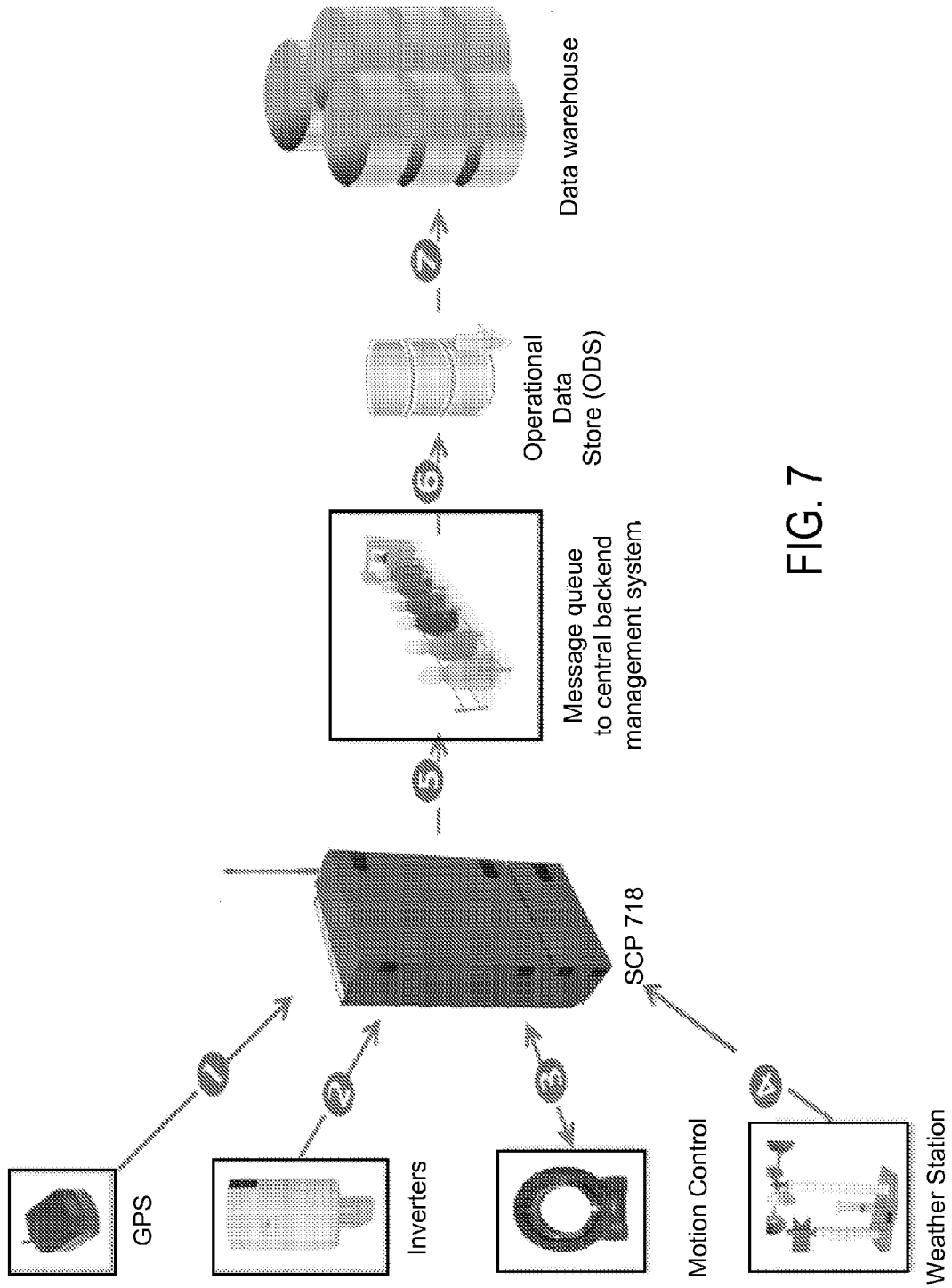
FIG. 7 illustrates a diagram of an embodiment of the wireless transmission/receiver circuit to transmit and receive communication to and from a router that is communicatively connected to a central backend management system over the Internet.

FIG. 7 illustrates a diagram of an embodiment of the wireless transmission/receiver circuit to transmit and receive communication to and from a router that is communicatively connected to a central backend management system over the Internet. The global positioning system (GPS) circuitry is configured to provide geographical position information of the CPV solar array of the two axis tracker mechanism at the solar site. The GPS on the two axis tracker mechanism eliminates any estimating of a particular tracker's location relative to the Sun in the sky or estimating where a particular tracker is positionally located in the row and columns of two axis tracker mechanism in the solar generation site, which allows a more accurate pointing of the solar array, with respect to the Sun. The central backend management system may include a set of servers, a message queue in the server, an operational data store, a data warehouse, and other components.

The wireless circuitry in the integrated electronics housing 718 is configured to transmit performance monitoring information to the central backend management system using a secure communication channel protocol. The wireless communication between the central backend management system allows substantial reduction in cabling and conduit laid throughout the site where the two-axis tracker assembly is located. The Wi-Fi communications to the central backend server management system via secure communications such as a Virtual Private Network.

As discussed, at least the motion control circuits, the inverter circuits and the GPS circuitry associated with the housing are configured to communicate information about the CPV solar array and the two-axis tracker mechanism to the central backend management system over the Internet via a wireless router for the LAN located at the solar site. The performance monitoring is designed into the circuitry and resident applications in the integrated electronics housing 718 for this photovoltaic system and the information then is communicated over the Internet to the central backend management system. At least the AC inverter circuitry and the motion control circuitry have test points built in their circuitry to provide performance monitoring of at least 1) an electrical power generating parameters including an amount of AC power generated, and 2) a solar array motion control parameters including a position of the PV solar array. The performance monitoring information is collected and stored in a memory in the housing. The performance monitoring information includes information for 1) a string of CPV cells supplying DC power in the solar array, 2) AC power, AC/DC current, AC/DC Voltages, and current to voltage (IV) curves associated with the inverter circuits, 3) configuration information of the string in the solar array, 4) ground fault conditions on the CPV cells, 5) a direct normal irradiation (DNI) information for the solar array, 6) streaming video captured by a camera associated with the solar array, 7) weather information including air temperature, wind speed, precipitation, and other local weather information where the solar array is located, 8) tracking information of the angular coordinates of the solar array, and 9) geographic position information of the solar at the solar site as generated by GPS circuitry, and then real time alarms and events are generated based on these collected parameters. 1) Configured logic, 2) resident software applications, or 3) any combination of both is also located in the integrated electronics housing and configured to collect and store the performance monitoring information in a memory of the integrated electronics housing. The information from the circuitry with test points for performance monitoring is then communicated by the communication circuitry to the central backend management system over the wide area network.

The on-board, real time, high resolution performance monitoring test points built into each of the components in the solar site allow remote control, monitoring, and alert notification features over the Internet of those components.

Various routines are scripted in code for monitoring components, triggering events, and alerting for the presence of 1) faulty components throughout the system; 2) string performance and failure conditions; 3) tracker position and motor function; 4) inverter performance and 5) other component alerts and failure conditions. Some are based on comparisons to threshold based on actual manufactured data.

Thus, enough parameters for each of the components are conveyed to obtain a complete picture of what is happening on each solar array at the site at each level of granularity. The system level tie-in between the hardware architecture and the software coded to operate and monitor the architecture provides enough parameters for each of the components to obtain the complete current picture as well as any historical data need for the complete picture with trend analysis.

Figure 8:
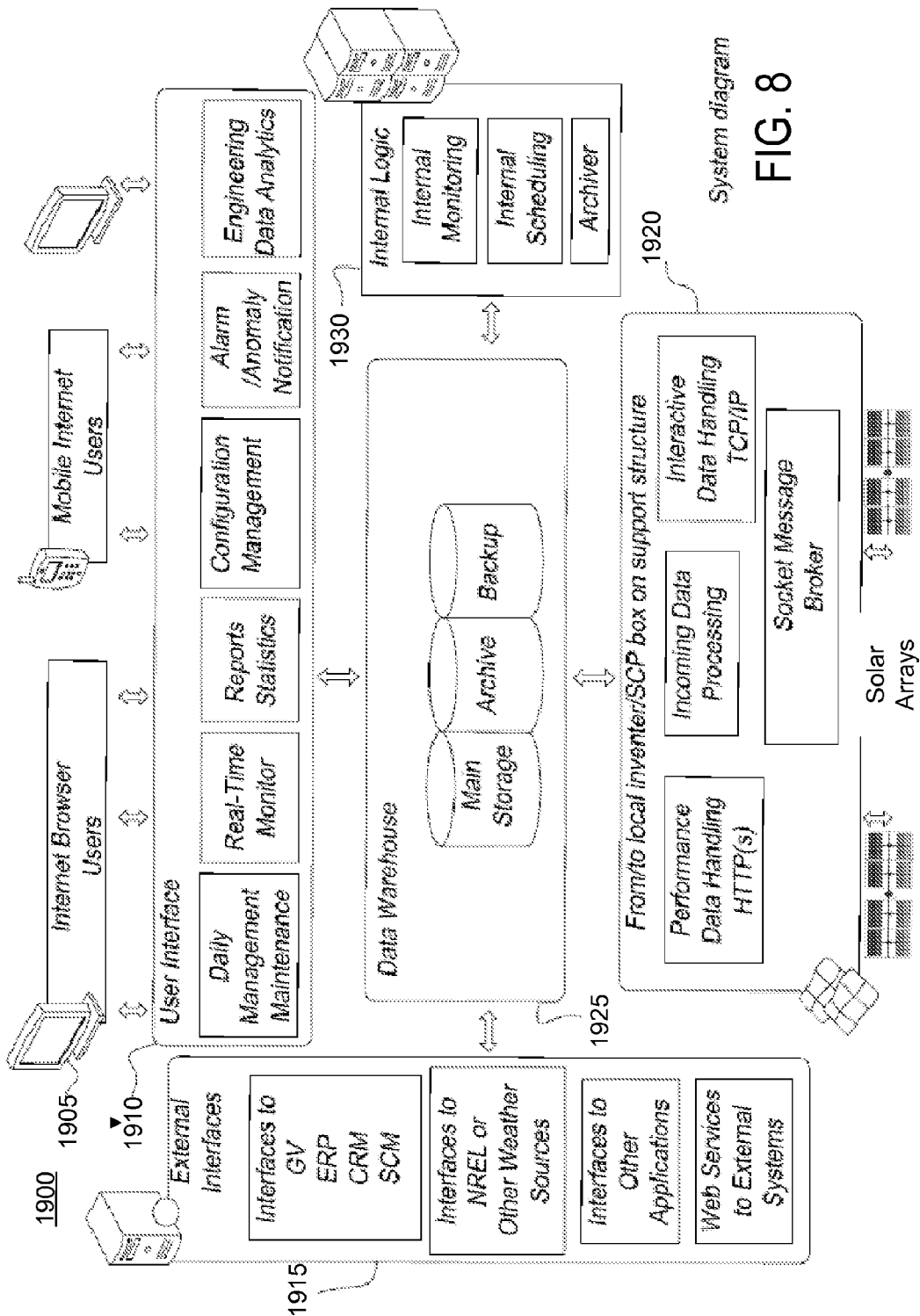
FIG. 8 illustrates an example system diagram for a central backend management system.

FIG. 8 illustrates an example system diagram for a central backend management system. The system diagram 1900 includes client computing systems 1905 (e.g., wired and wireless devices) communicating with the central backend management system, which includes the internal logic 1930, the data warehouse 1925 (e.g., main storage, archive, backup), solar site interfaces 1920, and external interfaces 1915. The external interfaces 1915 may be used to access external resources (e.g., web services, weather information, CRM, external applications, etc.) that may be necessary for the central backend management system to operate. As mentioned, the solar site interfaces 1920 of the central backend management system receives information from the solar site via the SCP's of the solar arrays over a secured connection. The central backend management system is configured to manage two or more remote solar sites, typically hundreds, each having a plurality of concentrated photovoltaic (CPV) arrays. The central backend management system is configured to service hundreds of client devices.

The various user interface dashboards 1910 served to the client computing system 1905 from the central backend management system may include a portfolio dashboard and a site dashboard. The user may also be able to access an array dashboard with daily, weekly, etc. view, an array dashboard on current to voltage (IV) curves (all strings or single string), an array tracking components dashboard, a string of CPV cells supplying DC voltage to an inverter dashboard, a visual browser including on-site camera dashboard, and many others. The dashboard for a portfolio, site, section, array, etc. may provide information about that element so that the user can select to control or monitor it for additional performance, manufacturing or configuration information.

The central backend management system receives information from the client device indicating that the user wants to view information related to or send commands to the two or more solar arrays located at the remote solar site. The central backend management system is configured to present a plurality of user interfaces via the Internet to a browser of each user's client device to enable the user to navigate to and then 1) view information for various components of the two or more solar arrays, 2) send a command to perform an action for various components of the two or more solar arrays, and 3) any combination of both for the various components associated with the two or more PV arrays. The central backend management system solicits authenticating information from the user and based on the authenticating information having been verified by the central backend management system as well as based on the central backend management system determining what information and commands that the user has been configured to view and or send related to the two or more CPV arrays located at the remote solar site. The plurality of user interfaces are viewable with the browser and are then presented on a display of the client device based on the central backend management system having authenticated the user as being allowed to view the information related to the PV array.

Figure 9A:
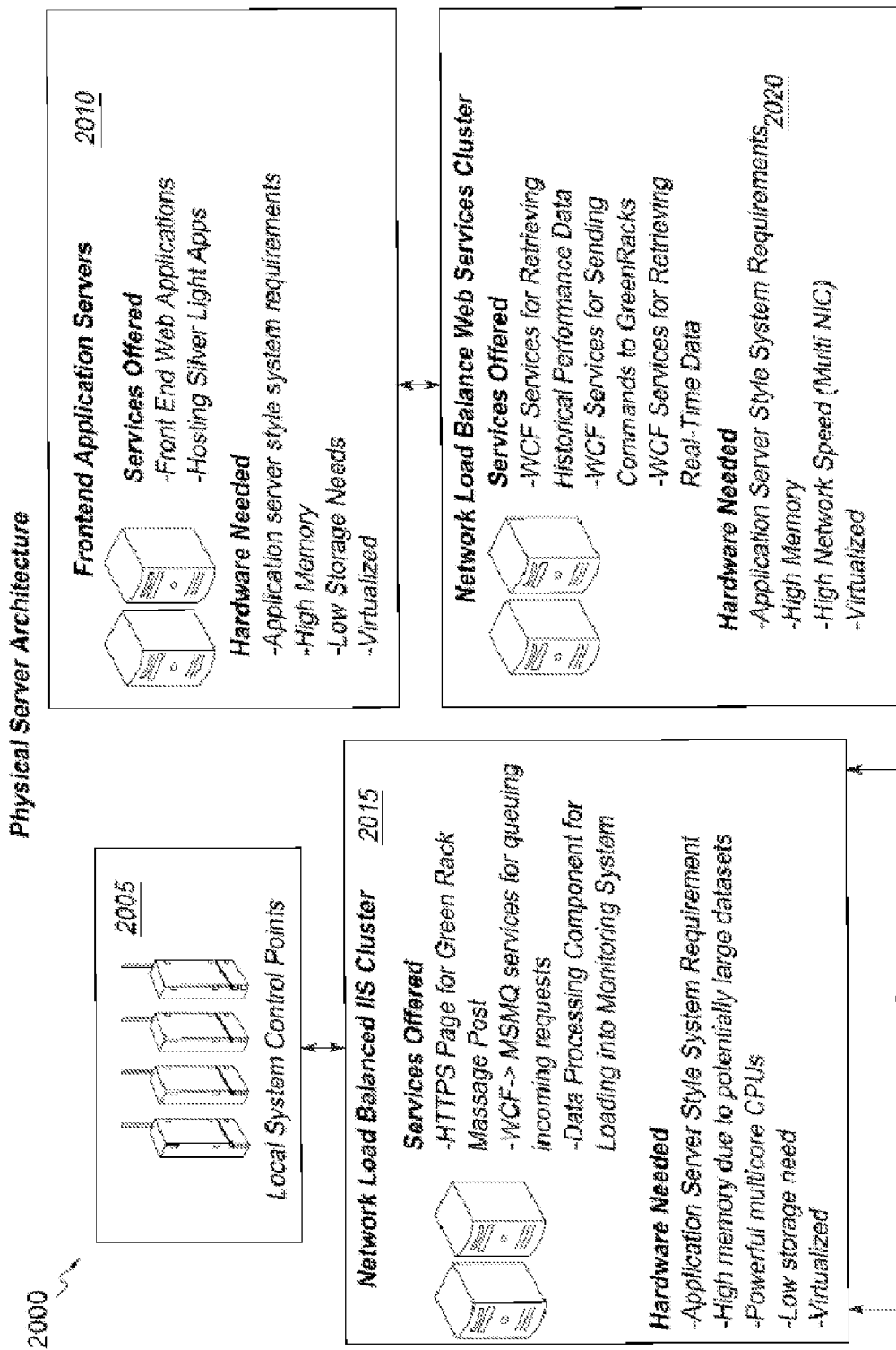
FIGS. 9A and 9B illustrate diagrams of an embodiment of an example hardware architecture of the central backend management system.
Figure 9B:
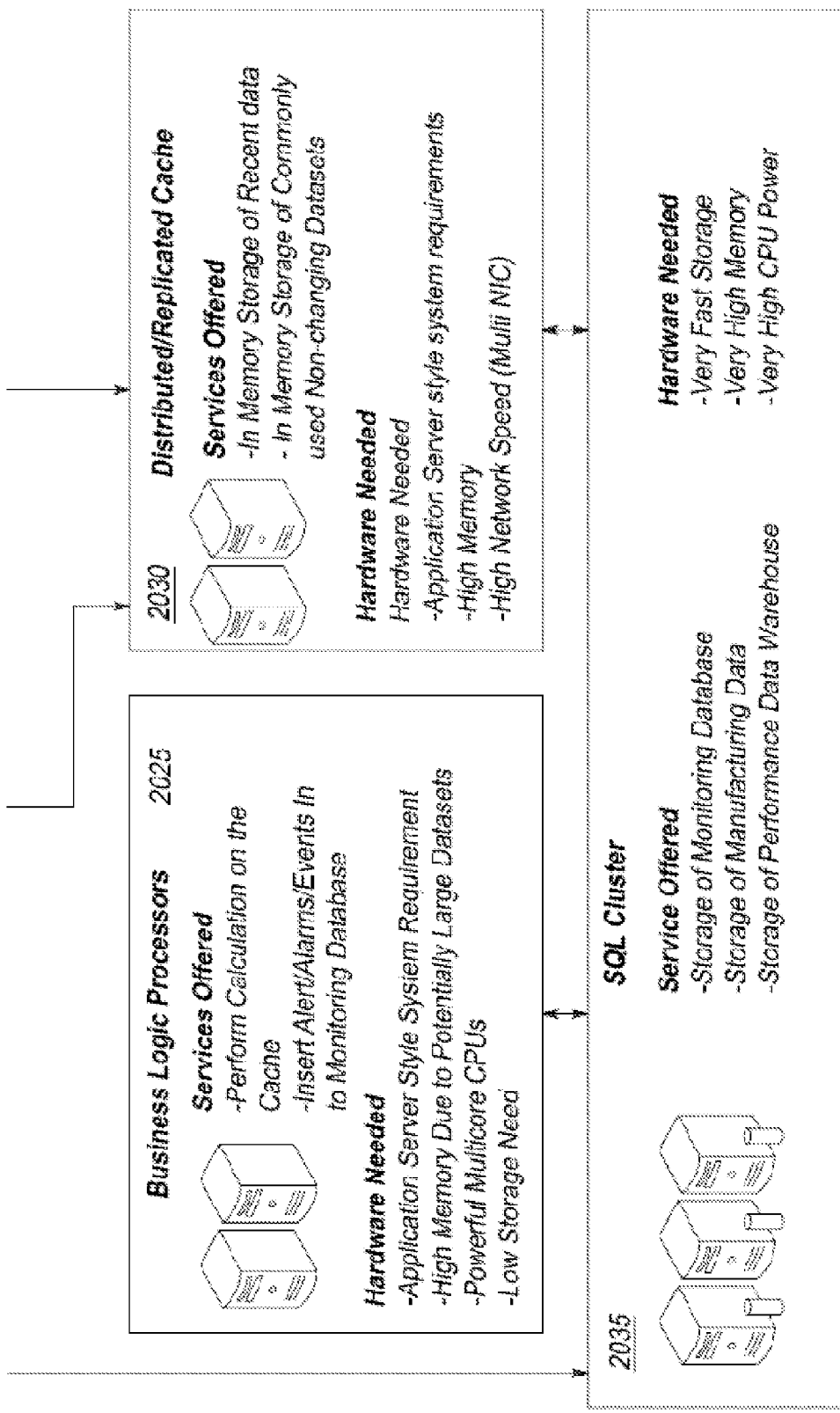

FIGS. 9A and 9B illustrate diagrams of an embodiment of an example hardware architecture of the central backend management system. The system 2000 includes a physical management server architecture that may include a system of server computers and databases. There may be multiple SCPs 2005, one per CPV array at the solar site. The SCPs 2005 are communicatively connected with the central backend management system over the Internet. The central backend management system may include frontend application servers 2010, network load IIS balanced cluster 2015, network load balanced web services cluster 2020, business logic processors 2025, distributed/replicated cache 2030, SQL cluster 2035 and other similar components.

The network load balanced Internet information server (IIS) cluster of servers 2015 may be configured to perform functions such as (1) HTTPS Page for SCP and ISIS Message posts, (2) Windows communication foundation (WCF)→Microsoft message queuing (MSMQ) service for queuing incoming requests, (3) data processing for various components in each CPV array for loading into the front end application servers 2010 and the monitoring system in the SQL cluster 2035, and (4) passing on control signals and requests from a client computing system through the central backend management system and onto the SCP, and (5) other similar functions.

The business logic processor 2025 may insert information, such as Alerts/Alarms/Events, for loading into the front-end application servers 2010 and the monitoring database in the SQL cluster 2035. The SQL cluster 2035 may store the monitoring database, performance database, and manufacturing database. The distributed/replicated cache 2030 may store information such as recent data and commonly used non-changing datasets. The SQL cluster 2035 and the distributed/replicated cache 2030 may form an Operational Data Store (ODS) that is a database repository for central backend management system 250. The network load balanced web services cluster 2020 provides WCF services for (1) retrieving historical performance data, (2) WCF Services for sending commands to the SCPs, (3) WCF Services for retrieving real-time data, and (4) other similar functions. The front-end application servers 2010 provide the web hosting of the web page, generation and/or presentation of user interfaces, and running of the front-end Web applications.

The command architecture for the SCP 310 may be a HTTP client/server architecture that exchanges XML messages constrained by a specific schema. The network load balanced server cluster 2015 of the central backend management system 250 may send XML commands through a TLS encrypted channel to each SCP 310 and expects XML responses from the SCP. Both sides follow the HTTP protocol requiring the appropriate headers.

The frontend application servers 2010 in the central backend management system may be configured to 1) provide web hosting for one or more web pages, and 2) generate and present a plurality of user interfaces to each browser application of a client device in communication with the frontend application servers in order to view information on components of the two or more PV arrays. The network load balance cluster 2015 handles communications and issuing of commands to control operations of the components of the two or more PV arrays. Each of the PV solar arrays is associated with a different system control point (SCP), which are communicatively connected to the central backend management system over the wide area network using a secured channel.

One or more sockets on the frontend application servers 2010 are configured to receive connections and communications from each client device over the WAN in order to enable the user of that client device to view information on components of the PV solar arrays associated with that user. The central backend management system is configured to send commands to the components of the PV solar arrays associated with that user via SCPs of those PV solar arrays. Thus, all commands to the PV solar arrays come from the central backend management system, which receives requests from the client devices to send those commands, verifies the identity and permissions associated with the user from the client device, and then sends the commands.

One or more servers in the central backend management system present a set of user interfaces viewable with the browser application to allow a user to drill down in the user interface and then view and interact with more specific components for the two or more CPV arrays.

Figure 10:
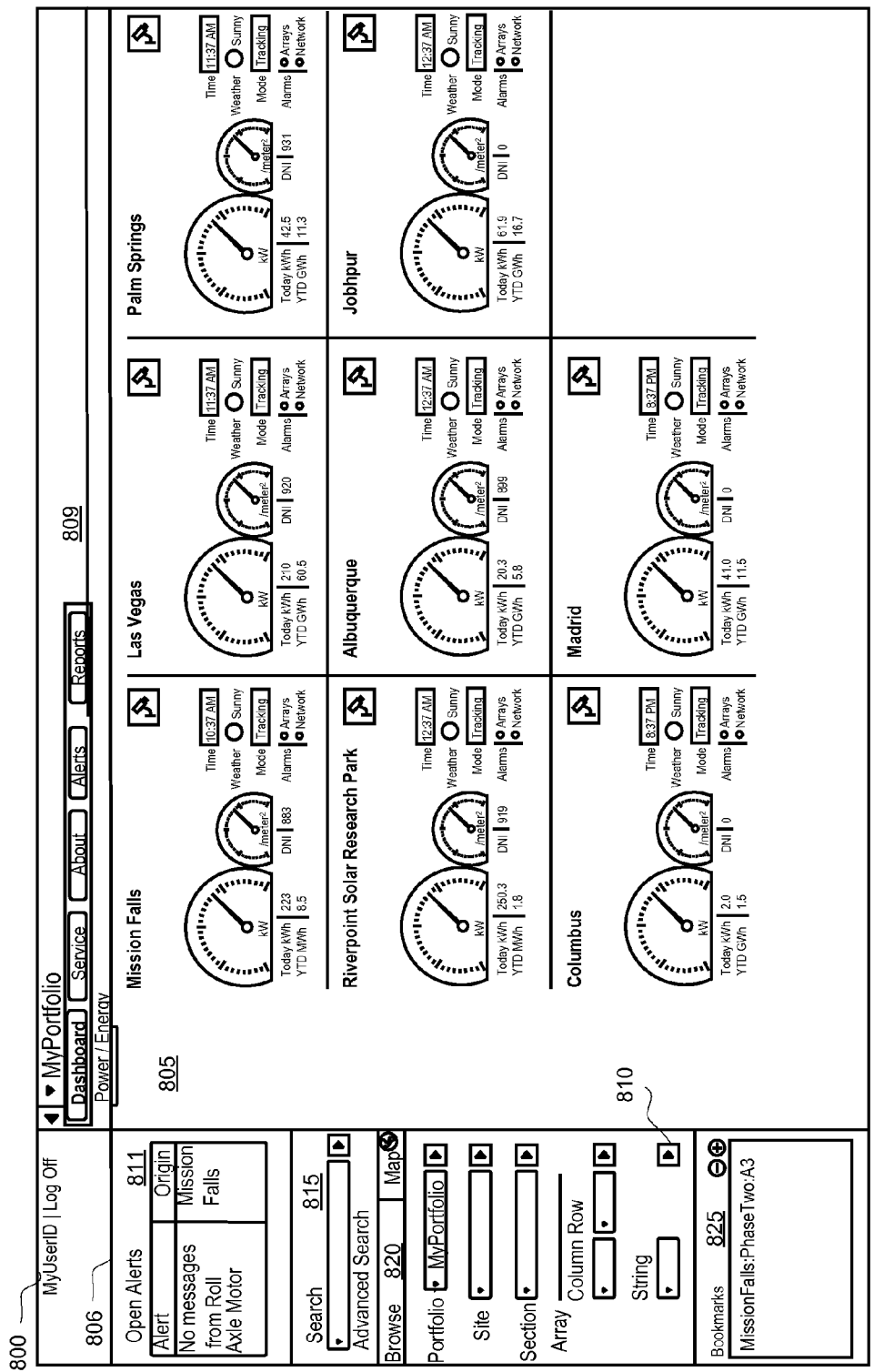
FIG. 10 illustrates a diagram an embodiment of an example portfolio dashboard user interface associated with the central backend management system.

FIG. 10 illustrates a diagram an embodiment of an example portfolio dashboard user interface associated with the central backend management system. The central backend management system presents a portfolio user interface viewable with the browser. The portfolio user interface includes overview information of one or more remote solar sites included in a portfolio that this user is associated with. The portfolio user interface 800 may be presented after the user is authenticated by the central backend management system. The portfolio user interface 800 includes a portfolio overview section 805 and dashboard tab section 809. The portfolio overview section 805 may display high-level or overview information about the solar sites in the portfolio of the user. The information may be displayed in a two dimensional array. The example in diagram 800 includes eight (8) solar sites—Mission Falls, Las Vegas, Palm Springs, Riverpoint Solar Research Park, Albuquerque, Jobhpur, Columbus and Madrid. It may be noted that even though these solar sites are located worldwide, the user may be able to manage and access information associated with these solar sites by connecting and logging into the central backend management system using the Internet.

As illustrated in FIG. 10, the overview information for each of the solar sites may include power/energy information, local time information, local weather information, alarm information, address information, video camera information, etc. The user may have the option of searching for a specific site, section, array or string and alternatively seeing the same information by drilling down the hierarchy of icons on the dashboard in order to view the drilled down site/array/string/tracker etc., overall status, alarm status, configuration information or manufacture information. The user may use the side panel 806 to drill down on to deeper levels of details about a particular solar site using browse options. Also in the side panel 806, the user may use the "+" button to save information in the favorite section for quick access to the same information (e.g., the energy information associated with a particular array of a solar site) at a subsequent time. An item in the favorite section may be a textual string that includes information about a particular site, section and array. A "−" button may be used to remove an item from the favorite section.

The central backend management system may allow the user to define other users who can manage its solar site. The user may be able to add or remove portfolios, view all the solar sites in a portfolio, add and remove sites from a portfolio, etc.

The dashboard tab section 809 includes dashboard tab, service tab, about tab, alerts tab and reports tab. Each of the tabs may be associated with one or more sub tabs. Each of the sub tabs may be associated with a different user interface and may present a different type of information or option to the user. Depending on how the user navigates the browse section 820 of the side panel 806, appropriate tab is activated and its associated sub tabs are available for the user to select. For example, when the dashboard tab is activated, the associated sub tabs power/energy, tracker, IV curves and camera are displayed.

The side panel 806 may include an alert section 811, a search section 815, a browse section 820, and a bookmarks section 825. The alert section 811 may be used to display alert information and to enable the user to view more details about certain alerts. The alert section 811 may allow the user to navigate to a particular alert by selecting or clicking on an alert name. The search section 815 may be used to enable the user to quickly search for information related to a component of a solar site that the user is associated with. The browse section 820 may be used to enable the user to browse information about a solar site by selecting parameters provided in pulled-down lists, thus enabling the user to drill down or access information at many different levels of details. The browse section 820 allows the user to navigate to the portfolio, the sites in the portfolio, the sections, arrays and individual strings in the solar site. When a navigation point (e.g., portfolio, site, section, array column, array row, and string) is selected, the activation arrow button 810 on the lower right of the browse section 820 may cause the appropriate dashboard to be displayed in the main panel 805. Each combination of navigation points may be associated with a different displayed graph in the panel. The side panel 806 may remain visible to the user regardless of where the user is in the process of managing the solar sites.

The central backend management system may present a second user interface viewable with the browser after the main user interface. The second user interface includes options to enable the user to specify the remote solar site in the portfolio and a component of the solar site that the user wants to view the information of. The central backend management system responsive to the user specifying the portfolio and the component, then presents a third user interface viewable with the browser. The third user interface is to display information related to the specified component, where the user can view information and send commands from the presented user interface that the user has been configured to view and send from.

Figure 11:
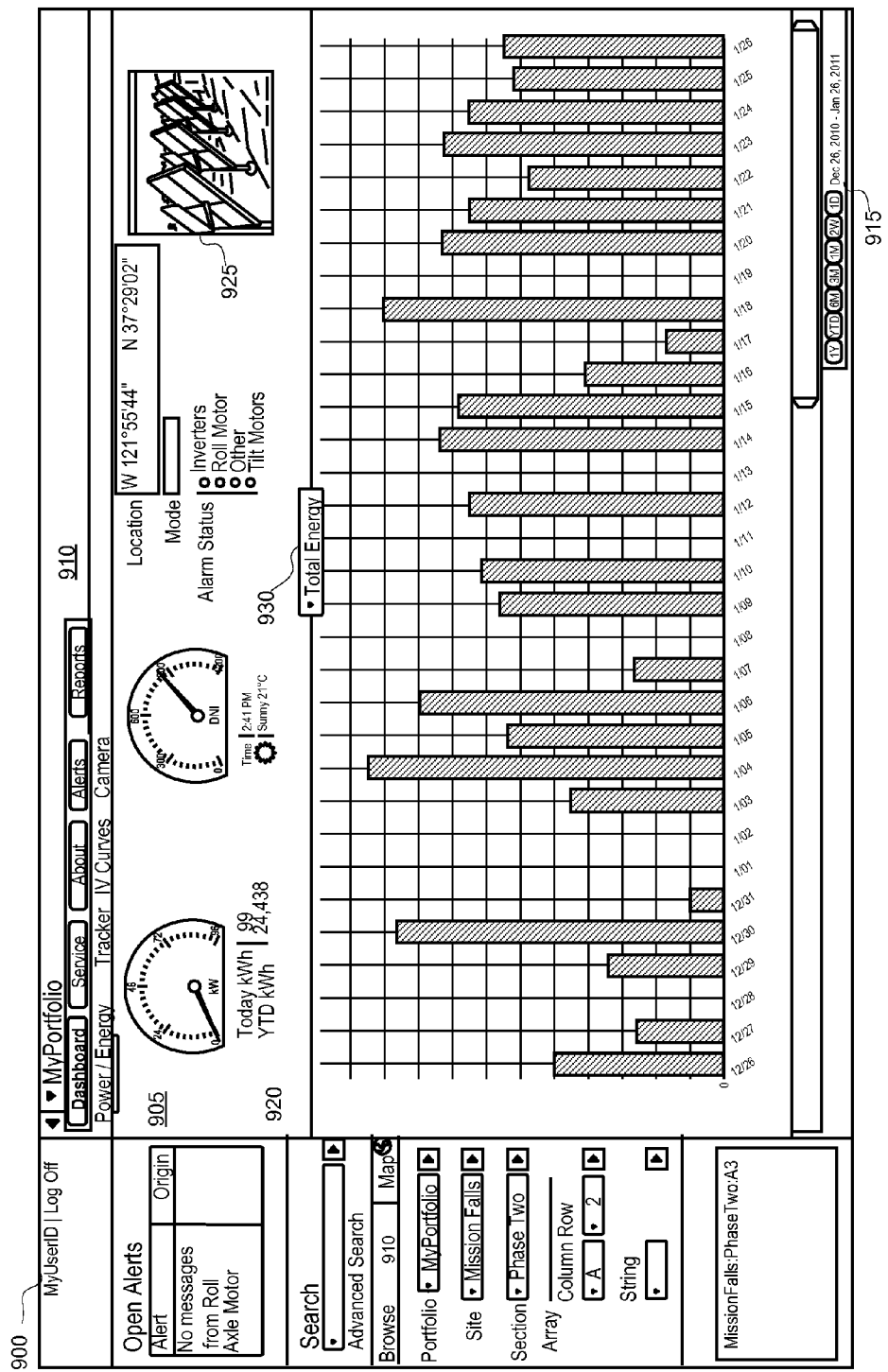
FIG. 11 is a diagram that illustrates an example energy dashboard user interface that displays electrical power and energy information.

FIG. 11 is a diagram that illustrates an example energy dashboard user interface that displays electrical power and energy information. The central backend management system is configured to present an energy user interface viewable with the browser to enable the user to view performance information related to the AC inverter power generating circuitry associated with the first solar array. The energy and power user interface 900 may be presented after the user navigates the browser section 910 to select a solar site, section, array and string. It may be noted that the power/energy sub tab under the dashboard tab may be activated as a default.

The power and energy information is presented as a bar chart 920 with the vertical axis representing the total energy in kilowatts hour (kWh) and the horizontal axis representing the dates. The timeframe of the information displayed in the bar chart 920 is defaulted at one month. The lower right section 915 of the dashboard allows the user to select varying timeframes from one day to one year. In the current example, the diagram 900 also includes a video box 925 that shows a small streaming video of the solar site along with the time information, DNI information, weather information, current day and year-to-date energy information, alarm status, GPS location information, and mode information. The user may alternatively view the view of the information from total energy to power and DNI by selecting the pull down option 930.

Section 905 in the main panel of diagram 900 includes a gauge showing kWh per day and year to date, a gauge showing DNI, local time, the weather and temperature information, the latitude and longitude of the SCP.

Figure 12:
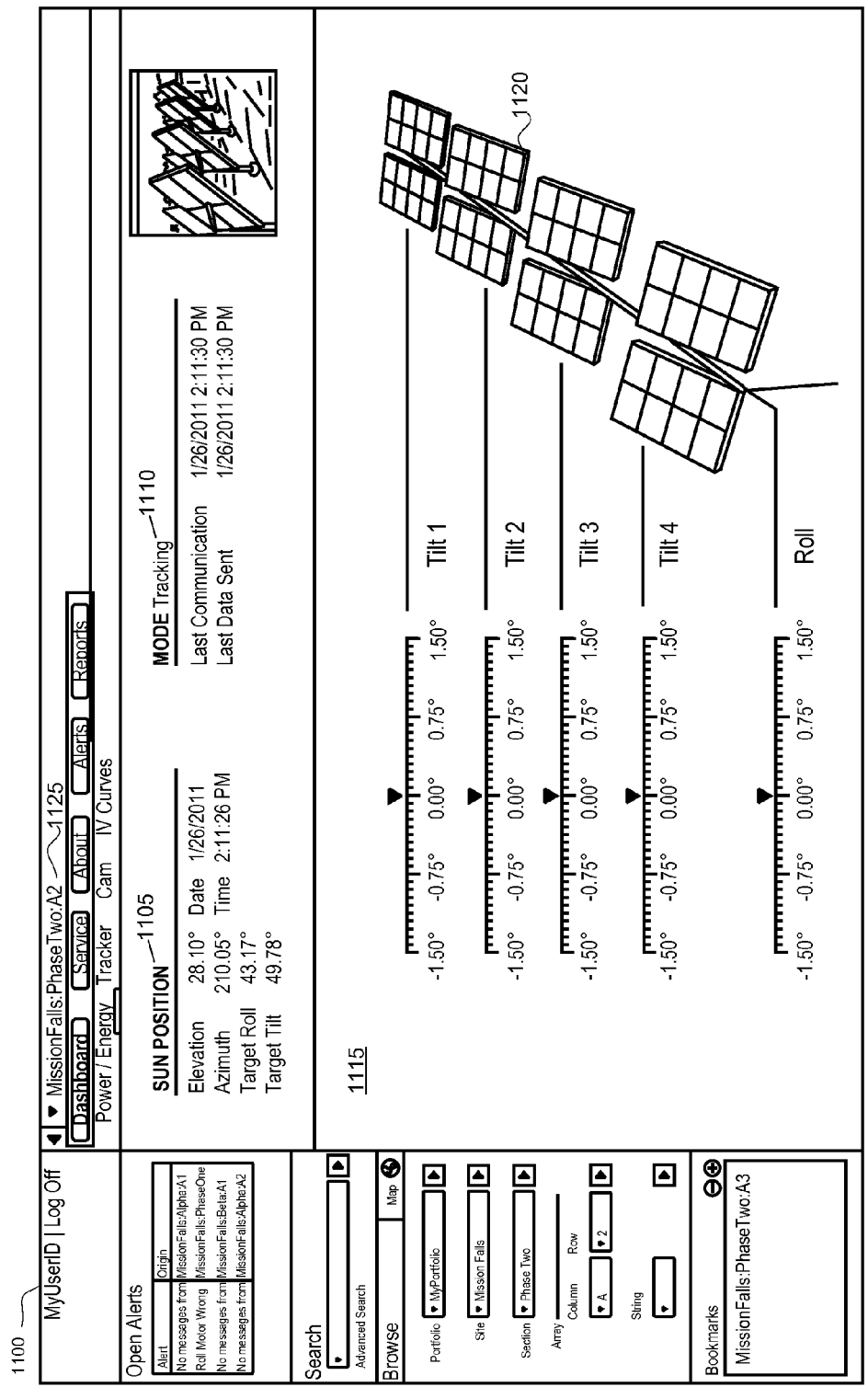
FIG. 12 is a diagram that illustrates an example tracker dashboard user interface that displays the multiple axis tracker assembly information.

FIG. 12 is a diagram that illustrates an example tracker dashboard user interface that displays the multiple axis tracker assembly information. The central backend management system is configured to present a tracker user interface viewable with the browser to enable the user to view information related to the two-axis tracker. The tracker user interface 1100 may be presented when the tracker sub tab under the dashboard tab is activated. The tracker user interface 1100 includes the sun position information 1105, the mode information 1110, and the paddle pairs positioning information 1115. This may enable the user to view the paddle pairs and roll beam actual versus commanded positions. The dashboard with the tracker control capability reinforces the user's comfort level on the reliability, durability and accuracy of the dual tracking system by showing for every array a near real-time tracking status of various parameters. For example, the user will be able to view the position of every axis for every array in relation to the sun. The user may be able to find out whether each axis of an array is tracking and the accuracy of the tracking. The date and time information about when the tracker of an array was last calibrated may be presented to the user. The user may also be able to view configuration information for a motor control board of an array. An image 1120 of the roll beam and associated paddle pairs may be displayed to enable the user to view the position changes. It may be noted that the diagram 1100 also displays navigation information 1125 that corresponds to the information being displayed in the main panel section of the diagram 1100. This navigation information 1125 may be similar to the information stored in the favorite section if the user decides to save it. In the upper right corner of the tracker user interface, the central backend management system is configured to present a third user interface viewable with the browser to enable the user to view a streaming video captured by a video camera at the remote site. The video user interface may be part of another user interface or a discrete user interface.

The set of user interfaces are in this graphical user interface system. The graphical user interface system includes intuitive navigation, and locations can be bookmarked for quick and easy return. Simply login at the customer portal page to set roles and authorizations for each client's particular system. The graphical user interface system allows monitoring performance and taking actions remotely, such as moving trackers, putting the system in stow mode, or resetting alarm or threshold limits. The graphical user interface dashboards show system conditions and performance of the solar arrays. Client devices can monitor performance in real time at the plant level or drill down in the user interface to a single string. The GUI dashboard shows current conditions, performance, and live video.

The central backend server management system allows management of the solar arrays at a remote site from a client device located anywhere a connection to the Internet is possible. The central backend server management system offers sophisticated remote interactive capabilities. Client device access is available anywhere on the Internet and data is protected through the use of secure IP protocols. The central backend server management system is a sophisticated, Internet-based, SaaS (software as a service) approach to power plant management that includes monitoring, diagnostics, and system control. Using the central backend server management system is easy and secure. The central backend server management system monitors system performance using a database, which contains factory test data for each component. If components such as modules, motors, or inverters are operating outside of specified limits, the central backend server management system will display on-screen alarms in the user interface and can send text or email alerts to operators.

The system also monitors weather forecasts and site conditions. Powerful analytics included in the central backend server management system help pinpoint potential performance issues and identify appropriate actions for remedy, including maintenance and repair. The central backend server management system provides sophisticated solar plant management by providing alerts to conditions and events occurring at each solar array, and allows monitoring, diagnosis, and control of each solar array, so that system operation and maintenance is highly efficient and low-cost.

The central backend server management system provides reporting, monitoring, analysis, and notification. In addition to current performance, historical energy potential and actual generation can be displayed. Analysis is graphical and reports can be customized. The central backend server management system maintains and protects each client's data and because of the software as a service model used by the central backend server management system, a client device never has to conform to or worry about software version control and updating.

Figure 13:
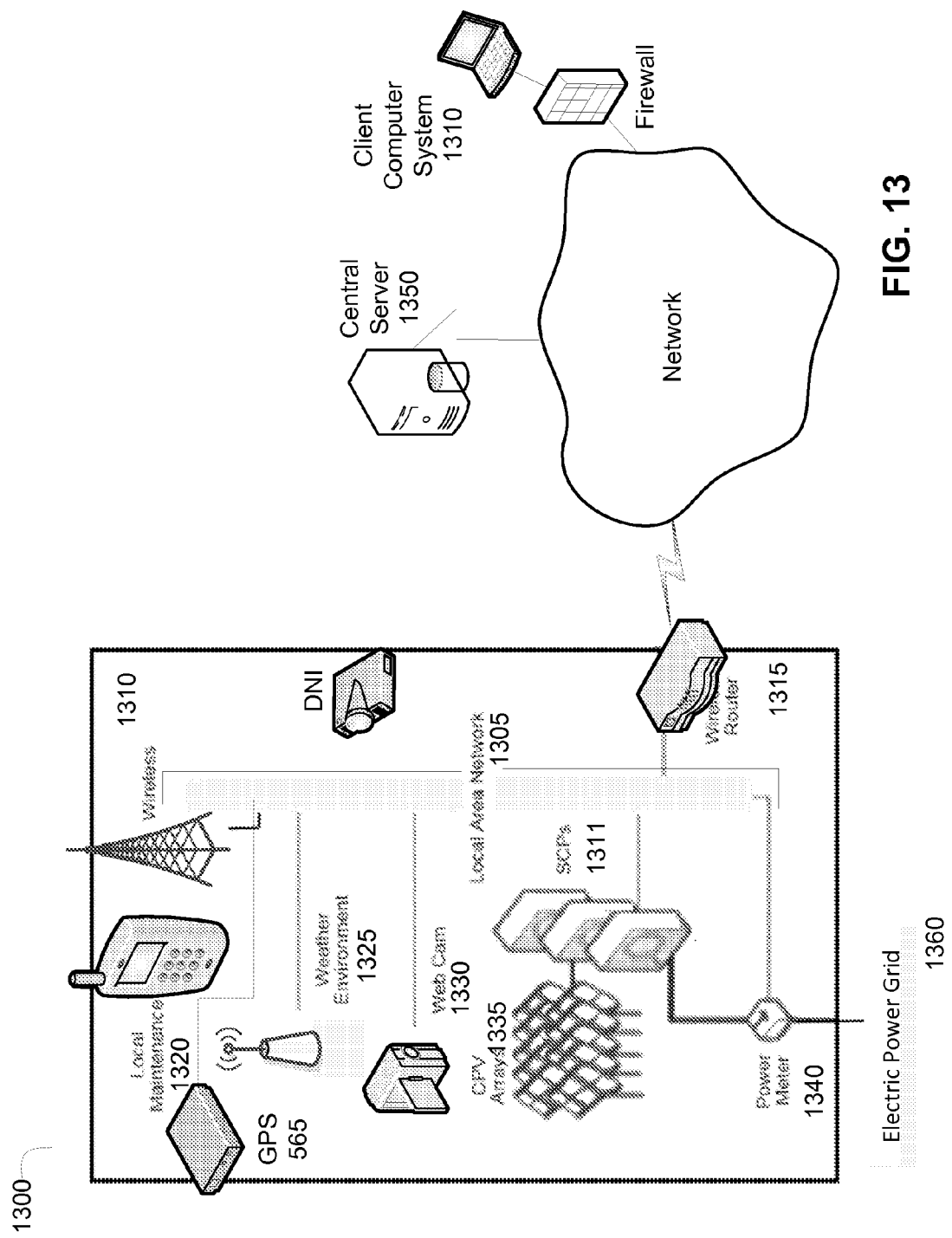
FIG. 13 illustrates diagrams of an embodiment of a wireless local area network (LAN) for a solar site with multiple CPV arrays.

FIG. 13 illustrates diagrams of an embodiment of a wireless local area network (LAN) for a solar site with multiple CPV arrays. Solar site 1300 may include a wireless local area network (LAN) 1305 for the two or more photovoltaic solar arrays at the remote solar site. Connected to the LAN 1305 is radio assembly 1310, GPS 1365, maintenance hand-held device 1320, video camera 1330, SCPs 1311, weather station 525, DNI meter, and power meter 1340.

Each photovoltaic array 1335 has its own SCP 1311 with the wireless communication circuitry inside that is configured to communicate to one or more site routers and then over the Internet with the central backend management system. The SCP 1311 may include motion control logic, inverter logic, etc. For example, the motion control logic may allow transitioning the paddles from an operational mode to a stow mode to prevent damage in adverse weather condition (e.g., gust wind, storm, etc.), and the inverter logic may allow converting DC power to AC power. A module in a single SCP may be configured to continuously monitor a local weather station relative to that solar site and broadcast the weather across the LAN to the rest of the SCPs.

The wireless communication circuitry is configured to communicate with the central backend server management system for exchanging control, monitoring, and management information via secure communications such as a Virtual Private Network. For some embodiments, a secured communication channel using Hypertext Transfer Protocol Secure (HTTPS) may be used for transmitting information between the SCP 1311 and the central server 1350 over the network. The SCP 1311 may use HTTPS POST to send performance data to the central server 1350. The SCP 1311 may ping the central server 1350 every time period (e.g., one minute) even when the SCP 1311 has no data to report. For some embodiments, the central server 1350 may respond with acknowledgement in response to the HTTP POST and can optionally send commands to the SCP 1311, requests the SCP 1311 to maintain a more frequent or permanent connection, throttle the speed of the SCP messages, etc.

The LAN allows faster communications between the devices located at the solar site than when those devices communicate over the Internet with the central backend management system.

The LAN also includes solitary devices at the site that can provide its information or functionality across the LAN to all of the two-axis tracker mechanisms located at that solar site. Thus, as discussed above, measured parameters common across the solar site, including direct normal incidence (DNI) and local weather, which are each 1) detected by a local detector, 2) retrieved by a local device or 3) a combination of both, and then broadcast as internal solar site communications over the LAN to all of the different SCPs at the site. The CPV arrays are associated with a local video camera mounted to survey the plurality of CPV arrays. A module may be configured to continuously monitor a local weather station relative to that solar site, and a solar power meter to measure an amount of DNI, and then broadcast updates of the measured amount of DNI and the time of that measurement. All of these are communicated over the LAN. The communications are faster and more reliable because Internet access to such information may occasionally become unavailable from time to time. Also, the measured parameters common across the solar site need only a single detector device rather than one device per two-axis tracker mechanism.

Figure 14:
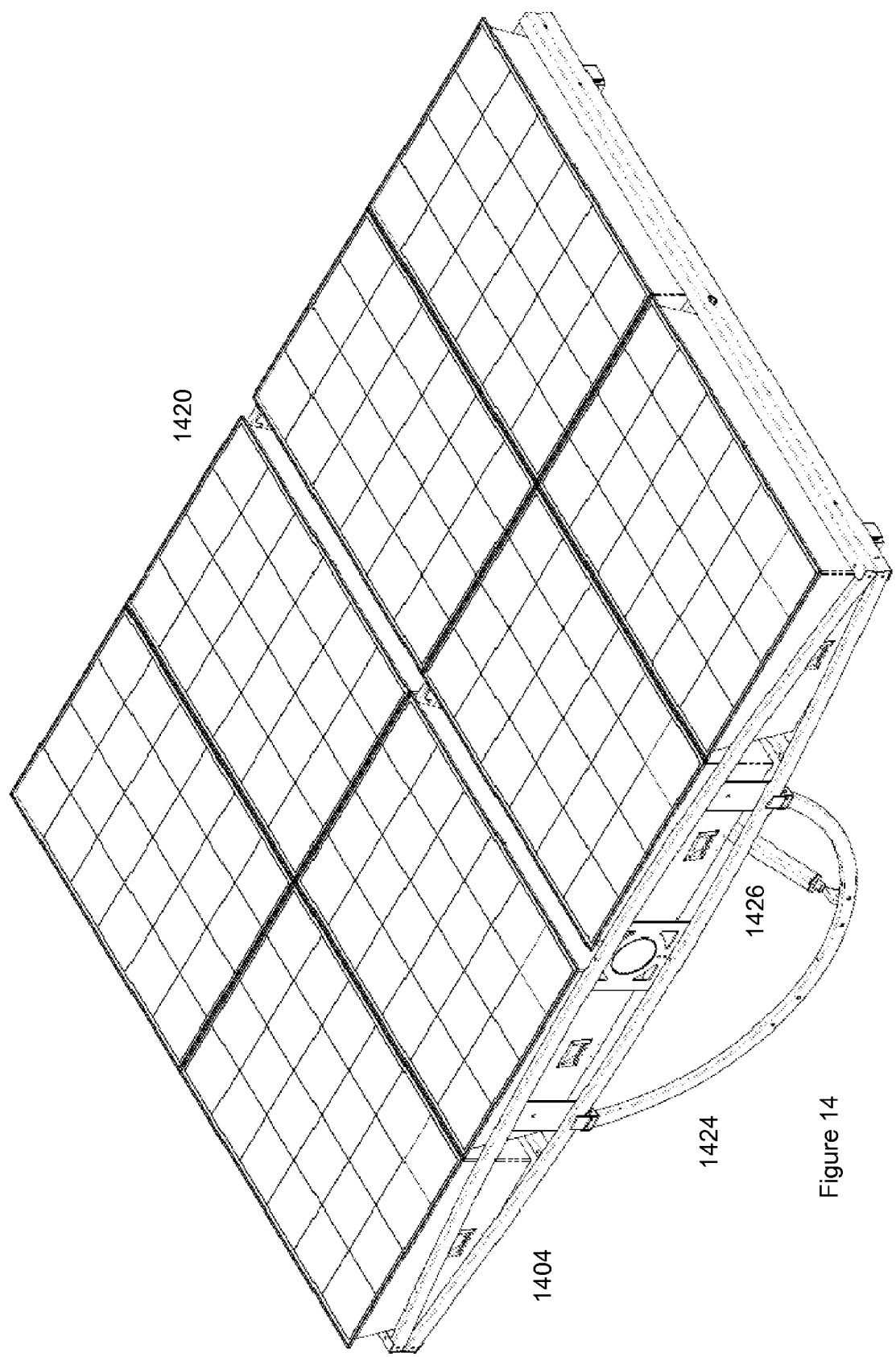
FIG. 14 illustrates a diagram of one or more modules aligned within and secured in place in a paddle structure.
Figure 15:
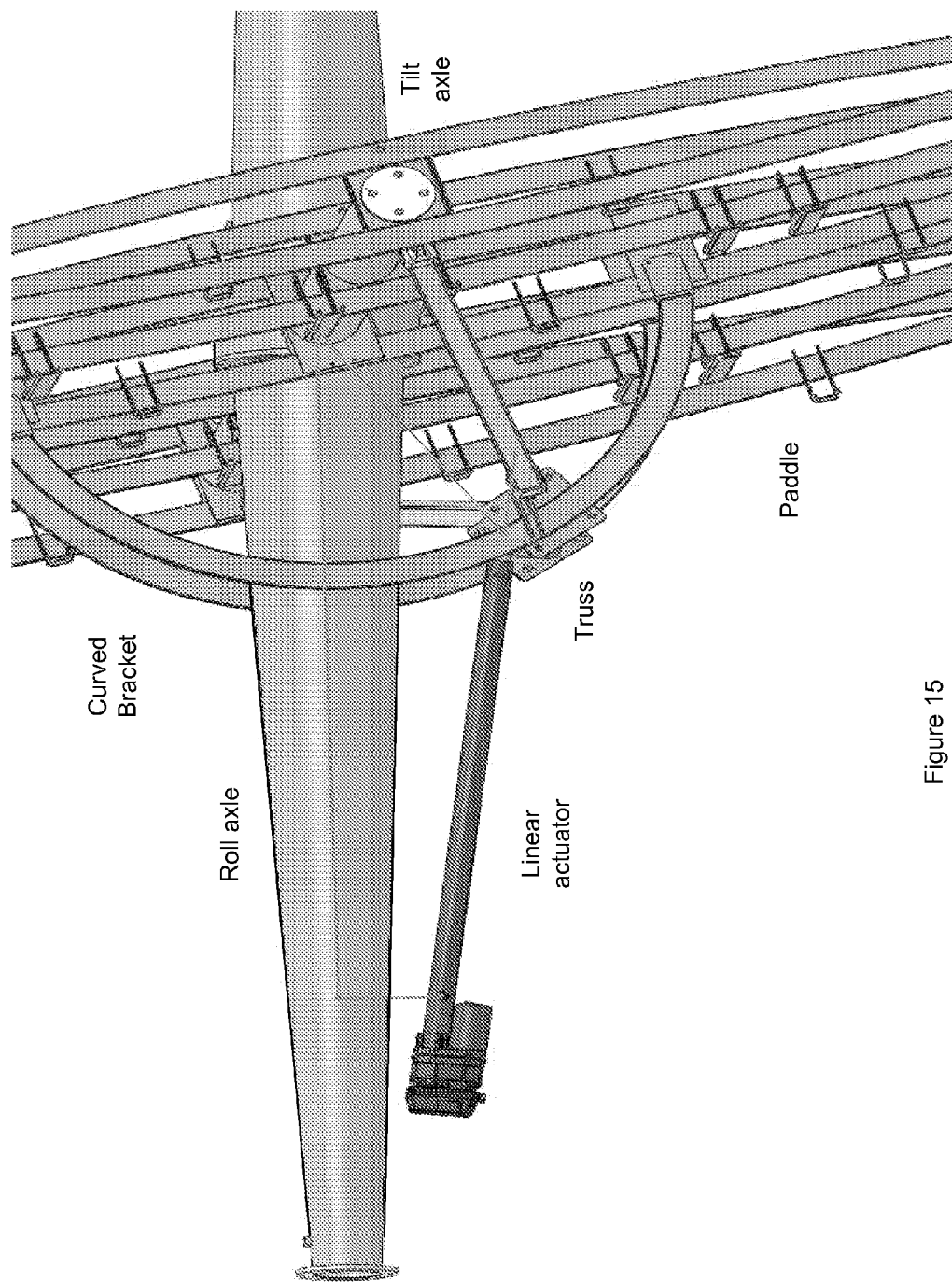
FIG. 15 illustrates a diagram of an embodiment of a side perspective of the frame of two paddle structures structurally locked together via the mechanical interface.
Figure 16:
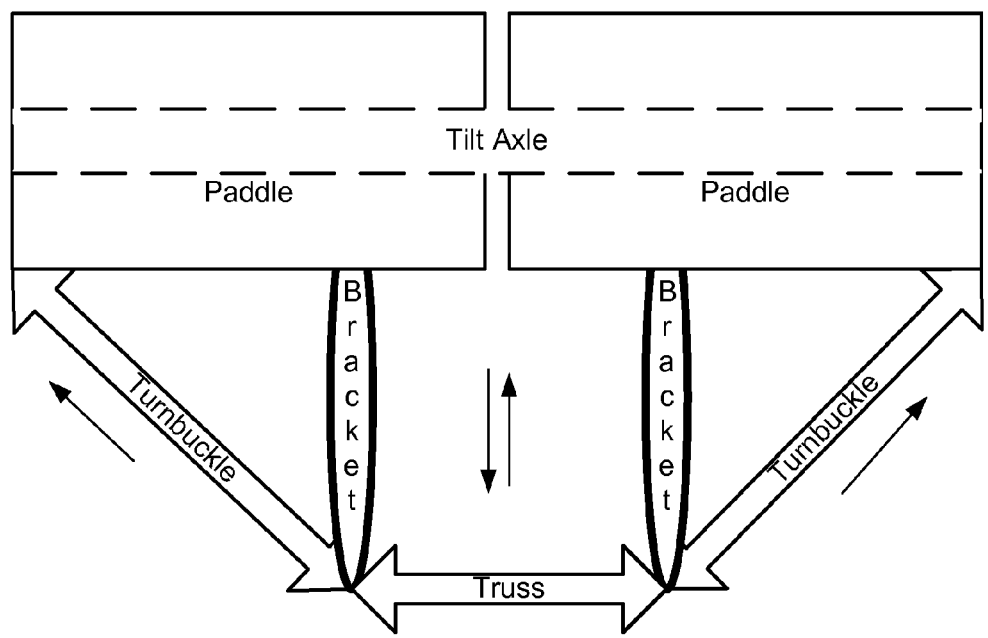
FIG. 16 illustrates a diagram of an embodiment of a paddle pair assembly on a tilt axle.

FIG. 14 illustrates a diagram of one or more modules aligned within and secured in place in a paddle structure. Each paddle structure 1404 may contain multiple CPV modules 1420 as part of the solar array of the two-axis tracking mechanism. Each paddle pair assembly has a shared mechanical interface between each paddle structure 1404, such as a curved bracket 1424 on each paddle structure 1404, a center truss between the brackets, and turnbuckle arms 1426 for vertical support to the paddle structure 1404 from the center truss, to structurally lock together the paddle structures to form a paddle pair assembly along the tilt axis on a tilt axle on the two sides of the common roll axle. The paddle pair assembly locked together then moves in unison on the tilt axis. See also FIG. 15 illustrating a diagram of an embodiment of a side perspective of the frame of two paddle structures structurally locked together via the mechanical interface. Note two or more paddle structures may form a single paddle assembly. The center truss, the curved bracket per paddle structure, a frame of each of the paddle structures, a tilt axle, and the turnbuckles form a support structure for a set of PV solar cells that are housed in the first solar array. See also FIG. 16 illustrating a diagram of an embodiment of a paddle pair assembly on a tilt axle. Each paddle pair assembly couples to its own linear actuator, which is used to control paddle assembly tilt articulation.

The shared mechanical interface between paddle structures in paddle pair assembly allows the solar array to be broken up into these multiple smaller paddle structures that are set along the tilt axis on a tilt axle on the two sides of the common roll axle. The smaller paddle structures and shared mechanical interface gives that paddle pair assembly a greater accuracy at aiming at the Sun due to 1) having less overall weight to drive the paddle pair assembly and 2) substantially an even amount of weight and wind forces felt on each side of the common roll axle on both paddle structures in the pair. Thus, the weight of the paddle structures on each side of the common roll axle counter balances the paddle pair assembly making the drive motor and linear actuators mainly having to deal with wind loading effects which should roughly be about the same on both sides of the paddle pair assembly. The wind loading force pressing against the surface area of paddle pair assembly should be directed through the frame of the paddle structures and the shared mechanical interface to essentially cancel the wind loading effects from the paddle structures on both sides of the common roll axle.

In addition, the paddle structure's bracket 1424 may be curved, triangular, or other shapes. The paddle structure 1404 has its bracket 1424 on hinges to allow the rapid formation of the paddle assembly on the tilt axle across both sides of the common roll axle in the field. Each hinge allows the bracket 1424 to fold flat against its skeletal frame when the paddle structure 1404 is shipped and also allows easy maneuverability when assembling the paddle assembly in the field.

Figure 17:
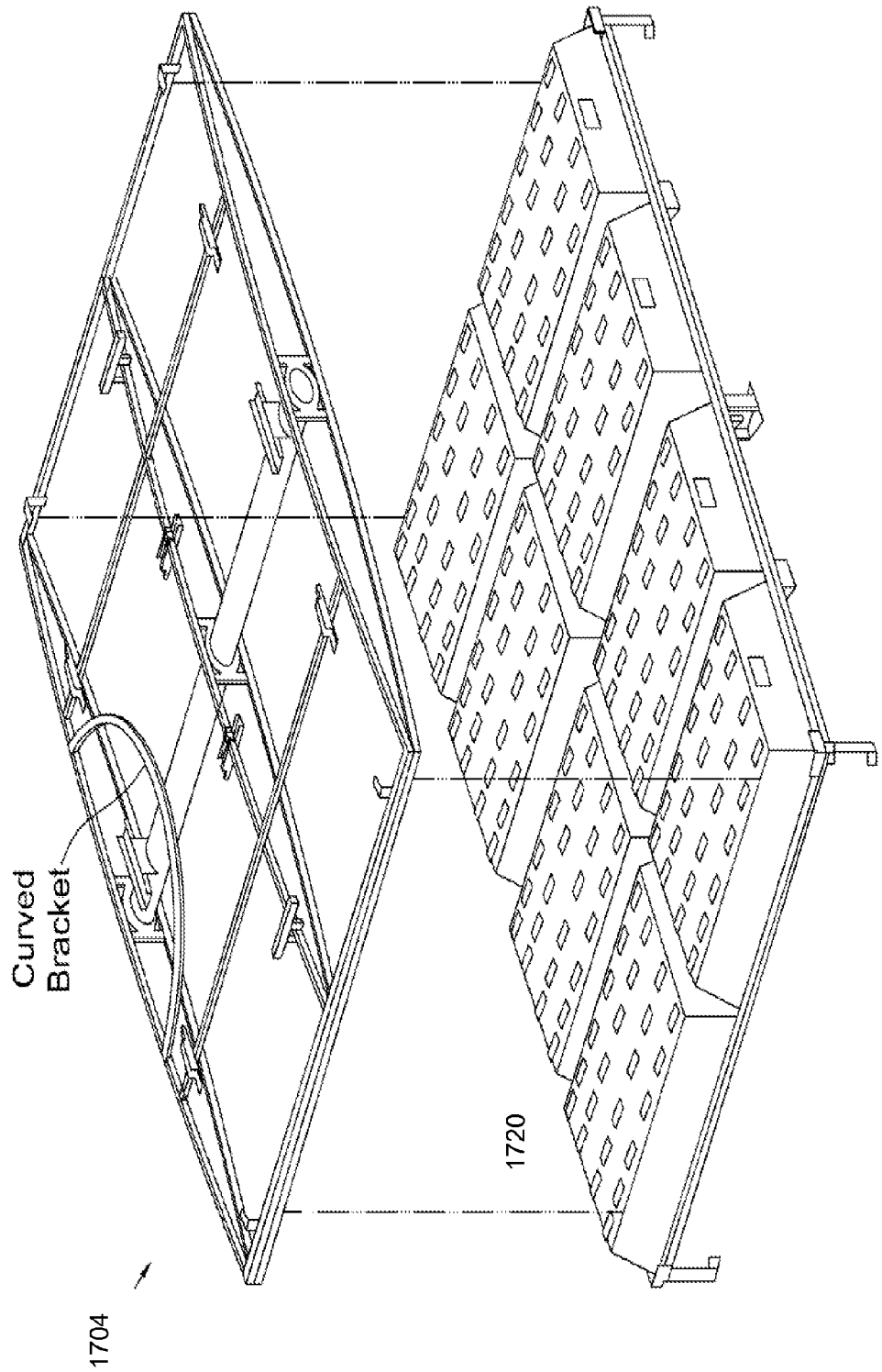
FIG. 17 illustrates an exploded view of an embodiment of a skeletal frame of the paddle structure coupling to multiple modules.

FIG. 17 illustrates an exploded view of an embodiment of a skeletal frame of the paddle structure coupling to multiple modules. Each paddle structure 1704 houses at least one of more modules 1720. The concentrating photovoltaic system includes rows and columns of photovoltaic cells packaged in the form of a module 1720. The solar array broken up into each paddle structure 1704 may, for example, contain eight module assemblies integrated together to make a rectangular grid, in which each module contains a fixed number of individual concentrated photovoltaic cells, such as twenty four. Each CPV solar cell is housed in a solar receiver assembly. Multiple solar receiver assemblies are installed also in an evenly spaced grid pattern of columns and rows into each module, and occupy the horizontal surface area of the module.

Figure 18:
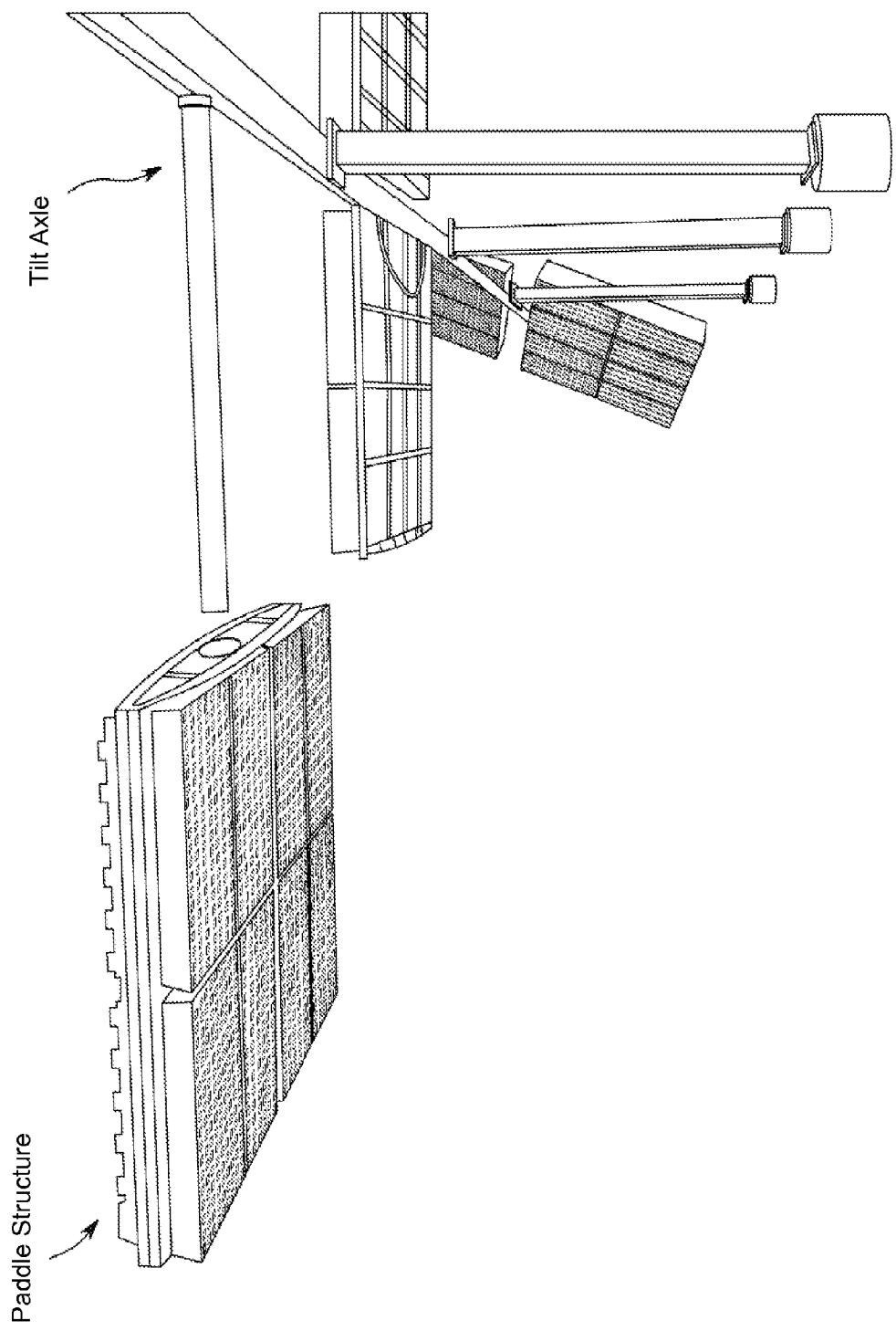
FIG. 18 illustrates a diagram of an embodiment of a paddle structure sliding in place and being installed in the field.

Each paddle structure has a bow shaped skeletal frame having a central tube for sliding the paddle structure onto a tilt axle of a multiple axis solar tracker assembly. (See also FIG. 18 illustrating a diagram of an embodiment of a paddle structure sliding in place and being installed in the field.) Each paddle structure has multiple brackets for mechanically securing modules containing PV cells in place. This overall structure of the paddle structure maintains a three dimensional alignment of the installed and aligned set of solar PV cells within each of the modules during shipment as well as during an operation of the multiple-axis tracker mechanism.

Figure 19:
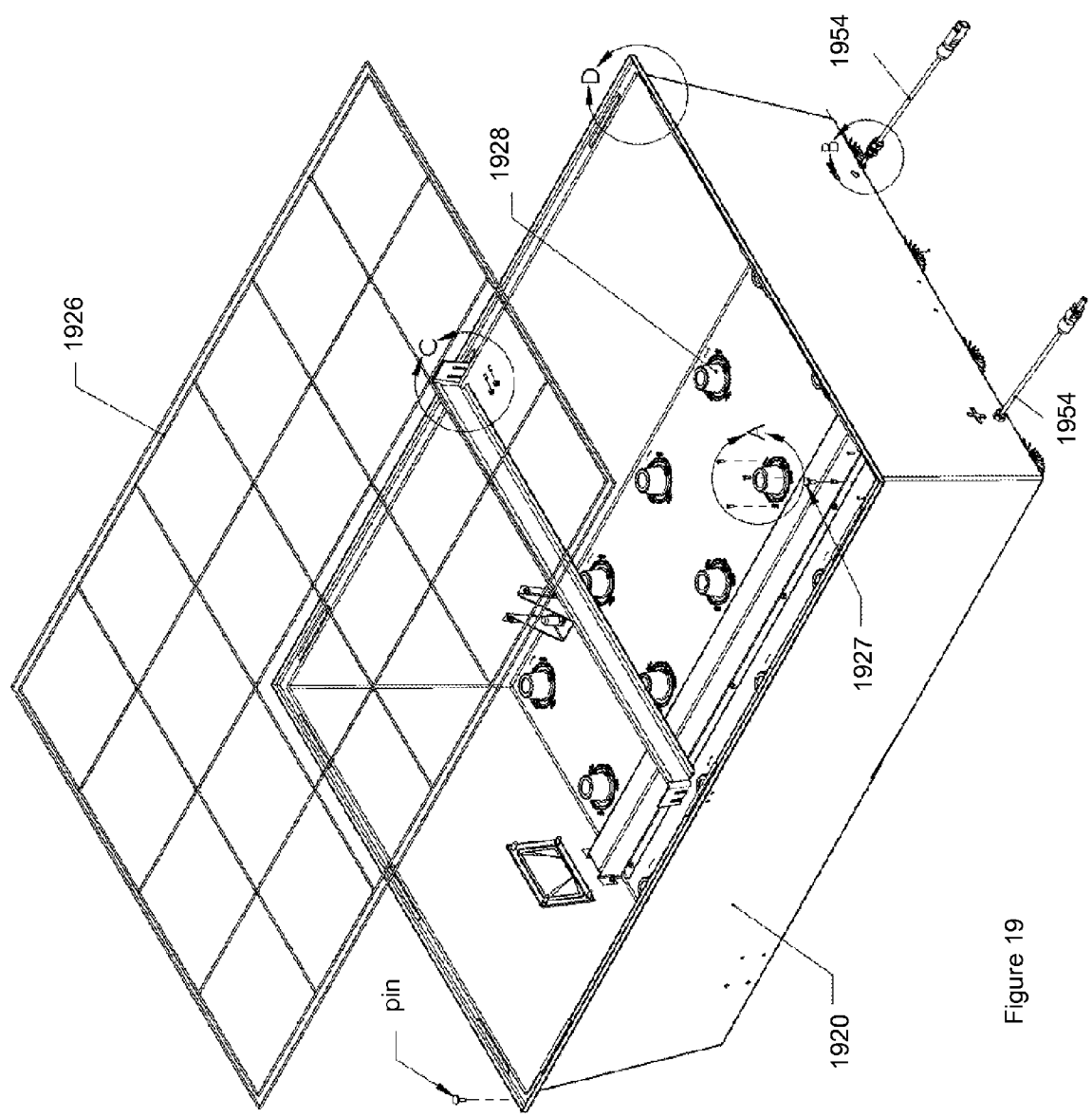
FIG. 19 illustrates an exploded view of a diagram of an embodiment of a module that has a grid of Fresnel lenses covering each set of solar receivers, a patterned panel of Fresnel lenses, and output leads.

FIG. 19 illustrates an exploded view of a diagram of an embodiment of a module that has a grid of Fresnel lenses covering each set of solar receivers, a patterned panel of Fresnel lenses, and output leads. The grid of Fresnel lenses 1926 use less material to construct than a normal convex lens and have a wider pointing angle than do conventional mirrors, and covers the module casing. Each solar receiver unit 1928, such as a first solar receiver unit 1927, contains its own secondary concentrator and its own photovoltaic cell, and optically couples with one of the Fresnel lens in the grid. Each solar receiver has its own secondary concentrator optic that focuses incident light onto its own photovoltaic cell. Multiple solar receiver units 1928 may exist per module and share the common grid of Fresnel lenses 1926 covering the module housing. The photovoltaic cells may be multiple junction solar cells located in its own solar receiver. Thus, each solar receiver has its own secondary concentrator optic that is aligned within and secured in place in that CPV module.

Each solar array contains a set of CPV cells are housed in the one or more CPV modules, which themselves are contained in a paddle structure. The modules containing the CPV solar cells when installed in the paddle structure come pre-aligned with respect to each other in all three dimensions and are locked into this aligned condition through the module housing and frame of the paddle structure to minimize the installation time by eliminating any need to align each individual CPV solar cell within the paddle structure in the field.

The set of CPV cells in their set of solar receivers within the module are also wired together during the manufacturing process to minimize the installation time by eliminating the need to make every CPV cell wiring connection in the field.

The multiple junction photovoltaic solar cells may be properly sized between four to six millimeters squared. The size of the multiple junction photovoltaic solar cell may be a tradeoff on 1) an amount of passive cooling provided by a heat sink coupled to that photovoltaic solar cell when the cell warms up to a steady state operational temperature to prevent overheating that photovoltaic solar cell and its associated lower DC voltage amount for that over heated solar cell, and 2) a limit on electron migration due to a total area of the multiple junction photovoltaic solar cell.

The concentrating photovoltaic (CPV) technology converts solar energy into DC power out very efficient under medium or high levels of DNI (direct normal irradiance). Each solar power unit may include: a primary optic, a secondary optic, a multi-junction photovoltaic cell and a heat sink for improved thermal performance for the photovoltaic cell. The primary optic concentrates the sun's light by a factor of 1,300× using a tempered glass Fresnel lens that features low sensitivity to temperature and chromatic aberrations. The secondary optic is a domed shaped top with trapezoidal bottom precision-formed optic that has a wide acceptance angle to simplify tracking requirements while delivering maximum power. The multi-junction photovoltaic cell has small dimensions and efficient passive thermal management to help maximize performance even at high temperatures. Note, regions with the greatest solar energy potential tend to be hot, which has an adverse effect on the efficiency of traditional photovoltaic solutions. However, the multi-junction solar cells have a very low temperature coefficient, which allows these solar cells to maintain significantly higher efficiency than other photovoltaic solutions. All of the solar receivers electrically combine and supply their voltage in output wires 1954.

Each module is tested for performance at the factory. The modules are pre-assembled and pre-wired into 2-kW paddle structures that are easily attached to the two-axis tracker assembly in the field.

Although the foregoing embodiments have been described in some detail for purposes of clarity of understanding, the invention is not limited to the details provided. The Solar array may be organized into one or more paddle pairs. The functionality of component blocks such as a server may be shared among multiple components or even located on another component. Functionality of circuit blocks may be implemented in hardware logic, active components including capacitors and inductors, resistors, and other similar electrical components, software written in any number of programming languages, or any combination of both. The software may be stored on a computing device readable medium in an executable format. There are many alternative ways of implementing the invention. The disclosed embodiments are illustrative and not restrictive.

We claim:

1. An integrated remotely controlled photovoltaic system, comprising:
    a central backend server management system configured to facilitate management of two or more solar arrays at a remote site from a client device connected over a public wide area network (WAN), which encompasses networks including the Internet;
    an integrated electronics housing containing multiple circuits for a first PhotoVoltaic (PV) solar array at the remote site, where the multiple circuits cohesively exist in the integrated electronics housing and actually perform better because of the interconnectivity;
    one or more Alternating Current (AC) inverter circuits within the integrated electronics housing with switching devices that generate a three-phase AC voltage supplied to a utility power grid interface transformer;
    one or more motion control circuits within the integrated electronics housing configured to move the PV cells of the first solar array throughout the day to angular coordinates resulting from a solar tracking algorithm feeding the motion control circuits;
    a communication bus within the integrated electronics housing connecting to the motion control circuits and the inverter circuits to facilitate communications of information including parameters of power being generated by the inverter circuits between the motion control circuits and the AC inverter circuits to fine tune an AC power generated out of the two axis tracker mechanism; and
    communication circuitry within the integrated electronics housing configured to establish secure communications over the WAN with the central backend server management system, where the motion control circuits and AC inverter circuits also pass information over the communication bus to the communication circuitry, and where the integrated electronics housing acts as the local system control point for the first solar array.

2. The integrated remotely controlled photovoltaic system of claim 1, wherein the central backend management system is configured to present a plurality of user interfaces via the Internet to a browser of the user's client device to enable the user to navigate to and then 1) view information for various components of the two or more solar arrays, 2) send a command to perform an action for various components of the two or more solar arrays, and 3) any combination of both for the various components associated with the two or more PV arrays, and
    wherein the plurality of user interfaces are viewable with the browser and are then presented on a display of the client device based on the central backend management system having authenticated in its database that the user of the client device as being allowed to take the action of viewing the information related to the PV array or sending a command to the PV array.

3. The integrated remotely controlled photovoltaic system of claim 2, wherein the first PV solar array is contained on a multiple-axis tracker mechanism, wherein the central backend management system is configured to present a first user interface viewable with the browser to enable the user to view information related to the two-axis tracker;
    wherein the central backend management system is configured to present a second user interface viewable with the browser to enable the user to view performance information related to the AC inverter power generating circuitry associated with the first solar array; and
    wherein the central backend management system is configured to present a third user interface viewable with the browser to enable the user to view a streaming video captured by a video camera at the remote solar site.

4. The integrated remotely controlled photovoltaic system of claim 1, wherein the central backend management system receives information from a client device indicating that a user wants to view information related to or send commands to the two or more solar arrays located at the remote solar site, where each of the solar arrays is coupled with its own system control point (SCP) communicatively connected to the central backend management system using the Internet, where the central backend management system solicits authenticating information from the user and based on the authenticating information having been verified by the central backend management system as well as based on the central backend management system determining what information and commands that the user has been configured to view and send related to the two or more CPV arrays then the central backend management system is configured to present a set of user interfaces viewable with the browser to allow a user to drill down in the user interface, and then view and interact with more specific components for the two or more CPV arrays;

present a first user interface viewable with the browser where the first user interface includes overview information of one or more remote solar sites included in a portfolio that this user is associated with, where the portfolio has two or more remote solar sites associated with the user;

present a second user interface viewable with the browser where the second user interface includes options to enable the user to specify the remote solar site in the portfolio and a component of the solar site that the user wants to view the information of; and responsive to the user specifying the portfolio and the component, present a third user interface viewable with the browser, where the third user interface is to display information related to the specified component, and then the user can view information and send commands from the presented user interface that the user has been configured to view and send from.

5. The integrated remotely controlled photovoltaic system of claim 1, where the established secure communications is a Virtual Private Network, and the communication circuitry is wireless communication circuitry that is configured to communicate with the central backend server management system for exchanging control, monitoring, and management information via the secure Virtual Private Network; and a wireless Local Area Network for the two or more photovoltaic solar arrays at the remote solar site, where each photovoltaic array has its own integrated electronics housing with the wireless communication circuitry inside that is configured to communicate to one or more site routers and then over the Internet with the central backend management system.

6. The integrated remotely controlled photovoltaic system of claim 5, where the wireless LAN communicates measured parameters common across the remote solar site, including direct normal incidence (DNI) and local weather, which are each 1) detected by a local detector, 2) retrieved by a local device, or 3) a combination of both, and then broadcast as internal solar site communications over the LAN to the different electronics housings, where each of the two or more solar arrays at the remote site has its own electronics housings.

7. The integrated remotely controlled photovoltaic system of claim 1, where the central backend management system is configured to manage two or more remote solar sites each having a plurality of photovoltaic (PV) arrays, a set of servers in the central backend management system is configured to 1) provide web hosting for one or more web pages, 2) generate and present a plurality of user interfaces to each browser application of a client device in communication with the frontend application servers in order to view information on components of the two or more PV arrays and 3) issue commands to control operations of the components of the two or more PV arrays, wherein each of the PV solar arrays is associated with a different system control point, which are communicatively connected to the central backend management system over the wide area network using the established secured communication channel; and one or more sockets on the set of servers are configured to receive connections and communications from a first client device of a first user over the WAN in order to enable the first user to view information on components of the PV solar arrays associated with the first user, wherein the central backend management system is configured to send commands to the components of the PV solar arrays associated with the first user via the SCPs of those PV solar arrays, wherein the one or more sockets on the servers are also configured to receive connections and communications from a second client device of a second user over the WAN to enable the second user to view information on the components of the PV solar arrays associated with the second user, wherein the central backend management system is configured to send commands to the components of the PV solar arrays associated with the second user via SCPs of those PV solar arrays, and thus all commands to the PV solar arrays come from the central backend management system, which receives requests from the client devices to send those commands.

8. The integrated remotely controlled photovoltaic system of claim 1, where both the AC inverter circuitry and the motion control circuitry have test points built in their circuitry to provide performance monitoring of at least 1) an electrical power generating parameters including an amount of AC power generated, and 2) a solar array motion control parameters including a position of the PV solar array, and 1) configured logic, 2) resident software applications, or 3) any combination of both is also located in the integrated electronics housing configured to collect and store the performance monitoring information in a memory of the integrated electronics housing, where the information from the circuitry with test points for performance monitoring is communicated by the communication circuitry to the central backend management system over the wide area network.

9. The integrated remotely controlled photovoltaic system of claim 8, wherein the configured logic, resident software applications or any combination of both is configured to actively push the performance monitoring information to the central backend management system instead of the central backend management system having to poll each PV solar array associated with its own SCP, and wherein communication between a first SCP for the first solar array and the central backend management system is performed using a secure communication channel protocol, which verifies the identity of both the central backend management system and the first SCP.

10. The integrated remotely controlled photovoltaic system of claim 1, wherein the first solar array is on a two-axis tracking mechanism, where a common roll axle of the two-axis tracking mechanism is composed of multiple segments of roll axle each with a perpendicular tilt axle, where two or more paddle structures containing one or more CPV modules are installed onto each tilt axle on the common roll axle as part of the two-axis tracking mechanism's solar array, where the two or more paddle structures couple across the common roll axle on that tilt axle, where each paddle assembly is pre-aligned by holes, brackets, or molded connection points, and any combination of these three, in a hinged bracket manufactured on each paddle structure in the paddle assembly for a correct coupling and positioning between the two or more paddle structures coupled across the common roll axle on that tilt axle, and where the common roll axle and each paddle assembly are manufactured in simple modular sections that assemble easily in the field while maintaining the alignment of the tracker assembly.

11. The integrated remotely controlled photovoltaic system of claim 1, wherein the first solar array is on a multiple-axis tracking mechanism having multiple independently movable sets of concentrated photovoltaic solar (CPV) cells;

a common roll axle of the multiple-axis tracking mechanism is located between 1) stanchions and 2) multiple paddle assemblies, where each of the multiple paddle assemblies contains its own set of the CPV solar cells that is independently movable on its own tilt axle from other sets of CPV cells on that two axis tracking mechanism, where each paddle assembly has its own drive mechanism for that tilt axle, where the common roll axle universally rotates all of the tilt axles, and each paddle assembly on a given tilt axle is driven by its own linear actuator along a tilt axis.

12. The integrated remotely controlled photovoltaic system of claim 1, where the first solar array is structurally broken up into multiple smaller paddle pair assemblies on a two axis tracker assembly, where each paddle pair assembly has a shared mechanical interface between paddle structures in that paddle pair assembly along a tilt axis on the two sides of a common roll axle, where the smaller paddle pair assemblies gives each paddle pair assembly a greater accuracy at aiming at the Sun due to 1) having less overall weight to drive that paddle pair assembly and 2) substantially an even amount of weight and wind forces felt on each side of the common roll axle in that paddle pair assembly, and thus, the weight of the paddle structures on each side of the common roll axle counter balances the paddle pair assembly, and thus, making drive motor and linear actuators of the two axis tracker assembly mainly having to deal with wind loading effects which should roughly be about the same on both sides of the paddle pair assembly.

13. The integrated remotely controlled photovoltaic system of claim 1, where the first solar array contains a set of CPV cells are housed in one or more CPV modules, which are contained in a paddle structure, where the modules containing the CPV solar cells when installed in the paddle structure come pre-aligned with respect to each other in all three dimensions and locked into this aligned condition through the module housing and frame of the paddle structure to minimize the installation time by eliminating any need to align each individual CPV solar cell within the paddle structure in the field, and the set of CPV cells within the module are wired together during the manufacturing process to minimize the installation time by eliminating the need to make every CPV cell wiring connection in the field.

14. The integrated remotely controlled photovoltaic system of claim 1, where the first solar array is structurally broken up into two or more paddle structures for ease of installation in the field, where each paddle structure has a bow shaped skeletal frame having a central tube for sliding the paddle structure onto a tilt axle of a multiple axis solar tracker assembly, and each paddle structure has multiple brackets for mechanically securing modules containing PV cells in place, where this overall structure of the paddle structure maintains a three dimensional alignment of the installed and aligned set of solar PV cells within each of the modules during shipment as well as during an operation of the multiple-axis tracker mechanism.

15. The integrated remotely controlled photovoltaic system of claim 1, where the first solar array is structurally broken up into multiple discreet components with two or more paddle structures, each paddle structure with its own set of CPV cells that are aligned within and mechanically secured in place in each module contained in a paddle structure making up the first solar array, where each PV cell has its own secondary concentrator optic optically coupled to a photovoltaic cell, where each paddle structure is constructed such that one or modules with their set of solar PV cells are contained in the paddle structure maintain the set of solar PV cells' alignment when installed in the paddle structure in the fabrication process and while installed in the field.

16. The integrated remotely controlled photovoltaic system of claim 1, where the first solar array is structurally broken up into multiple discreet components with two or more paddle structures, each paddle structure with its own set of CPV cells, having a curved bracket to structurally lock each paddle structure together through a center truss and turnbuckle arms to form a paddle assembly that moves in unison, and the paddle structure with its curved bracket is configured to allow the paddle structures to form a single paddle assembly along the tilt axis on a tilt axle on the two sides of the common roll axle, where the center truss, the curved bracket per paddle structure, a frame of each of the paddle structures, a tilt axle, and the turnbuckles form a support structure for a set of PV solar cells that are housed in the first solar array.

17. The integrated remotely controlled photovoltaic system of claim 1, where the photovoltaic cells are multiple junction solar cells and a set of solar receivers is organized in a grid pattern in modules, each solar receiver has its own secondary concentrator optic that is aligned within and secured in place in that CPV module; and each solar receiver has its own secondary concentrator optic that focuses incident light onto its own photovoltaic cell, where all of the photovoltaic cells on the two axis tracker mechanism are electrically connected to form the voltage output from the solar array.

18. The integrated remotely controlled photovoltaic system of claim 1, where the multiple circuits contained within the integrated electronics housing further includes:

software coding and logic circuitry that are built-in for PV string level performance monitoring on the solar array to allow 1) real-time performance feedback, 2) remote monitoring of the two axis tracker assembly, and 3) local measurements and generation of a current-voltage (IV) curve;

a solar tracking algorithm with a hybrid open and closed loop tracking algorithm configured to supply coordinates to the motion control circuit to adjust/fine tune the angle of the PV cells to achieve a maximum power output;

a central processor circuitry configured to perform the Ephemeris calculation of the solar tracking algorithm for use by the motion control circuits to position the PV cells relative to a current angle of the Sun;

a global positioning system (GPS) circuitry which is configured to provide geographical position information of the first PV solar array at the remote solar site, where the GPS coordinates, time, and day of the year are supplied to the solar tracking algorithm; and where the central processor circuitry is configured to also to compute and generate alarms in near real time, calculating performance modeling, and other general processing include network communications requiring computation to transmit to the central backend management system over the WAN.

19. The integrated remotely controlled photovoltaic system of claim 1, where at least two or more AC inverter circuits are contained with the integrated electronics housing, and where a primary-side common node of the Utility Power grid interface transformer is connected to Earth ground, where each inverter circuit has its own set of isolation contacts to connect as well as isolate this particular inverter from the Utility Power Grid interface transformer, where each inverter circuit receives a bipolar DC voltage supplied from its own set of CPV cells, and where the outputs of the two or more AC inverter circuits combine to supply the primary-side common node of the Utility Power grid interface transformer.

20. The integrated remotely controlled photovoltaic system of claim 1, where the photovoltaic cells are multiple junction solar cells, and where the multiple junction photovoltaic solar cells are properly sized between four to six millimeters squared, where the size of the multiple junction photovoltaic solar cell is a tradeoff on 1) an amount of passive cooling provided by a heat sink coupled to that photovoltaic solar cell when the cell warms up to a steady state operational temperature to prevent overheating that photovoltaic solar cell and its associated lower DC voltage amount for that over heated solar cell, and 2) a limit on electron migration due to a total area of the multiple junction photovoltaic solar cell, and wherein one or more strings of multiple junction solar cells from the solar array are wired together such that its highest end-to-end voltage, unloaded, cold cells is not in excess of 1200 V DC but supplied at a high enough level to directly convert this DC input voltage level to a 480 V AC working voltage level coming out of each three-phase AC inverter circuit while avoiding the need for a DC boost stage in each three-phase AC inverter circuit.

* * * * *